US006628521B2

(12) United States Patent
Gustine et al.

(10) Patent No.: US 6,628,521 B2
(45) Date of Patent: Sep. 30, 2003

(54) MECHANICAL HOUSING

(75) Inventors: Gary Gustine, Bonham, TX (US); Charles G. Ham, Mound, MN (US); Michael Sawyer, Riverview, FL (US); Fredrick Daniels, Floral City, FL (US); Michelle Bishop, Mission Viejo, CA (US); Lane King, Dallas, TX (US); Matthew Kusz, Minneapolis, MN (US)

(73) Assignee: ADC Telecommunications, Inc., Minnetonka, MN (US)

( * ) Notice: Subject to any disclaimer, the term of this patent is extended or adjusted under 35 U.S.C. 154(b) by 0 days.

(21) Appl. No.: 09/804,129

(22) Filed: Mar. 12, 2001

(65) Prior Publication Data

US 2002/0054481 A1 May 9, 2002

Related U.S. Application Data

(60) Provisional application No. 60/246,174, filed on Nov. 6, 2000.

(51) Int. Cl.[7] .................................................. H01K 7/20
(52) U.S. Cl. ........................ 361/704; 361/688; 361/707; 165/80.3; 165/106.33
(58) Field of Search ................................. 361/688, 690, 361/702–710, 712–714, 717–720, 722–723, 727, 749–756; 174/705, 47, 16 HS, 163, 52.1, 16 AS; 165/80.1, 106.33, 80.2, 80.3, 185, 177, 179, 181, 104.26, 104.14; 138/108; 45/601; 228/176, 123.1; 438/3, 616; 336/849, 602.1, 232, 200, 83, 198, 252, 265; 363/147, 21, 144; 205/125

(56) References Cited

U.S. PATENT DOCUMENTS

| | | | |
|---|---|---|---|
| 2,737,579 A | 3/1956 | Wehrlin et al. | |
| 2,796,559 A | 6/1957 | Feucht | |
| 2,833,966 A | 5/1958 | Goodier et al. | |
| 2,876,277 A | 3/1959 | Badger et al. | |
| 3,087,095 A | 4/1963 | McConkey, Jr. et al. | |
| 3,135,321 A | 6/1964 | Butt et al. | |
| 3,366,171 A | 1/1968 | Scharli | |
| 3,467,891 A | 9/1969 | Mogle | |
| 3,487,267 A | 12/1969 | Winston et al. | |
| 3,809,798 A | 5/1974 | Simon | |

(List continued on next page.)

FOREIGN PATENT DOCUMENTS

EP 1 041 002 A2 10/2000

(List continued on next page.)

OTHER PUBLICATIONS

Abacon Telecommunications, HDSL Low Capacity Repeater Case, 1 pg., date unknown.

(List continued on next page.)

Primary Examiner—Michael Datskovsky
(74) Attorney, Agent, or Firm—Fogg and Associates, LLC; Laura A. Ryan

(57) ABSTRACT

An apparatus for containing objects, such as electronic circuit cards, and a method for making the same, the apparatus having a housing; at least one case disposed within the housing, the case adapted to confine the objects to different locations within the housing and comprising a frame, the region within the frame divided into two regions by a first partition, each of the two regions divided into a plurality of sections by a plurality of second partitions, each of the second partitions thermally coupled to the frame and the first partition, each of the sections divided into a plurality of slots, each slot having an object disposed therein for thermal contact between the first partition, a second partition, and one of a second partition and the frame; and at least one heat sink adapted to absorb heat from the case, the heat sink thermally coupled to the case and the housing.

137 Claims, 12 Drawing Sheets

U.S. PATENT DOCUMENTS

| | | | |
|---|---|---|---|
| 3,997,819 A | | 12/1976 | Eggert et al. |
| 4,172,212 A | | 10/1979 | Heinzer |
| 4,184,539 A | | 1/1980 | Rein |
| 4,259,843 A | * | 4/1981 | Kausch ............................ 62/3 |
| 4,449,576 A | | 5/1984 | Baum et al. |
| 4,528,615 A | | 7/1985 | Perry |
| 4,547,833 A | | 10/1985 | Sharp |
| 4,559,790 A | * | 12/1985 | Houston .................... 62/259.3 |
| 4,656,559 A | | 4/1987 | Fathi |
| 4,662,002 A | | 4/1987 | Davis et al. |
| 4,679,250 A | | 7/1987 | Davis et al. |
| 4,777,561 A | | 10/1988 | Murphy et al. |
| 4,815,913 A | | 3/1989 | Hata et al. |
| 4,858,068 A | | 8/1989 | Bitller et al. |
| 4,858,070 A | | 8/1989 | Buron et al. |
| 4,953,058 A | | 8/1990 | Harris |
| 4,962,445 A | | 10/1990 | Pelet et al. |
| 5,019,939 A | | 5/1991 | Reimer |
| 5,045,971 A | | 9/1991 | Ono et al. |
| 5,089,935 A | | 2/1992 | Ito |
| 5,105,337 A | | 4/1992 | Bitller et al. |
| 5,267,122 A | | 11/1993 | Glover et al. |
| 5,309,315 A | | 5/1994 | Naedel et al. |
| 5,329,425 A | | 7/1994 | Leyssens et al. |
| 5,424,916 A | | 6/1995 | Martin |
| 5,519,573 A | | 5/1996 | Cobb et al. |
| 5,842,514 A | | 12/1998 | Zapach et al. |
| 5,896,268 A | * | 4/1999 | Beavers ...................... 361/690 |
| 6,002,588 A | * | 12/1999 | Vos et al. .................... 361/708 |
| 6,038,129 A | * | 3/2000 | Falaki et al. ................ 361/699 |
| 6,045,140 A | | 4/2000 | Morris, Jr. |
| 6,104,611 A | | 8/2000 | Glover et al. |
| 6,118,662 A | * | 9/2000 | Hutchison et al. .......... 361/704 |
| 6,209,631 B1 | * | 4/2001 | Garsia-Ortiz ............... 165/287 |
| 6,289,678 B1 | * | 9/2001 | Pandolfi ...................... 62/3.2 |
| 6,292,556 B1 | | 9/2001 | Laetsch |
| 6,295,208 B1 | | 9/2001 | Murchison et al. |
| 6,310,772 B1 | | 10/2001 | Hutchinson et al. |
| 6,396,129 B1 | * | 5/2002 | Pagnozzi .................... 361/690 |
| 6,404,637 B2 | | 6/2002 | Hutchison et al. |

FOREIGN PATENT DOCUMENTS

| | | | | |
|---|---|---|---|---|
| GB | 2 193 552 | | 2/1988 | |
| JP | 56-93634 | | 6/1981 | |
| JP | 58-105187 | | 7/1983 | |
| JP | 60 79834 | | 5/1985 | |
| JP | 62-26936 | | 2/1987 | |
| JP | 62-67936 | | 3/1987 | |
| JP | 62-79404 | | 4/1987 | |
| JP | 2-4287 | | 1/1990 | |
| JP | 2-166798 | | 6/1990 | |
| JP | 7-177645 | | 7/1995 | |
| JP | 8-65868 | | 3/1996 | |
| JP | 2001085879 A | * | 3/2001 | ............ H05K/7/20 |

OTHER PUBLICATIONS

Abacon Telecommunications, HDSL High Capacity Repeater Case, 2 pgs., date unknown.

Circa Enterprises, Inc. "Digital Repeater Housings—HDSL Repeater", 2 pgs. 2000.

Circa Enterprises, Inc. "Digital Repeater Housings—T1 Repeater", 2 pgs., 2000.

"Hardened Telecon Enclosures for Optimal Thermal Management of Electronics", SPC TelEquip, pgs. 1–20, Date unknown.

Seri Lee, "How to Select a Heat Sink," Electronics Cooling, 9 pgs., Oct. 6, 2000.

Joe Ricke Sr., "Managing Heat in Electronic Enclosures," Electronic Packaging & Production, pp. 87–88, 90, 92, vol. 36, No. 2, Feb. 1996.

* cited by examiner

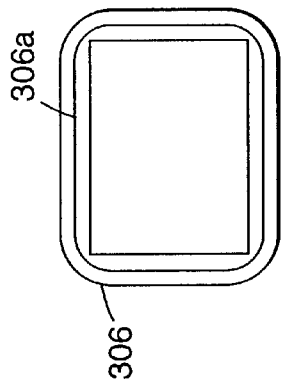
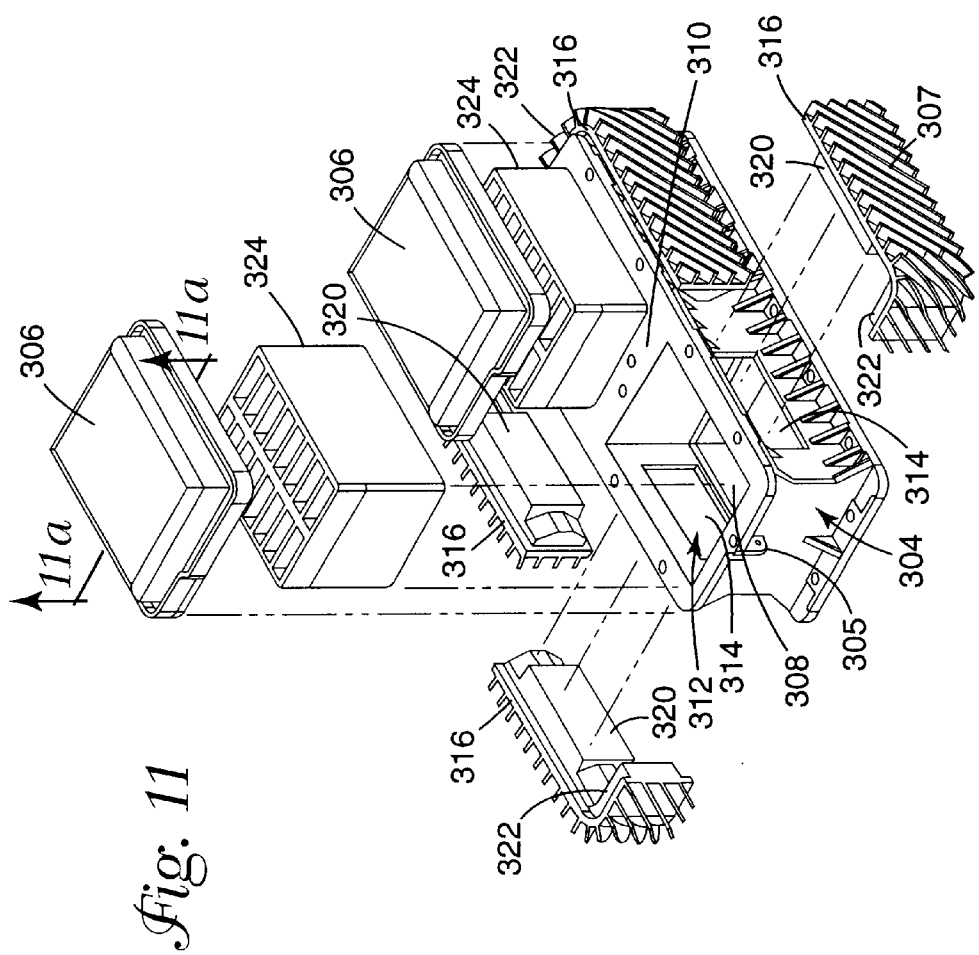

MECHANICAL HOUSING

This application claims benefit under 35 U.S.C. §119(e) of U.S. Provisional Application Serial No. 60/246,174, filed Nov. 6, 2000, which is incorporated herein by reference.

CROSS RELATED APPLICATIONS

This application is related to co-pending, application Ser. No. 09/804,106 and U.S. Pat. No. D462,675 S entitled CABLE HEAD ASSEMBLY and RADIATING REPEATER CASE, respectively, and filed on even date herewith, which applications are incorporated herein by reference.

TECHNICAL FIELD

The present invention relates generally to the field of environmentally protected housings for containing electronic components and, in particular, to the enhanced cooling of electronic components contained within environmentally protected housings.

BACKGROUND

Environmentally protected housings are used in a wide variety of applications, including containing and protecting electronic components of the type used for transferring signals over long distances. For example, the telecommunications industry transfers signals over optical fibers. If the signal is transferred over a long distance, the signal may be too weak by the time it reaches its destination to be useful. Consequently, electronic circuit cards are used to detect, clean up, and amplify a weak signal for retransmission through another length of fiber-optic cable. These electronic circuit cards are often deployed in environmentally protected housings located above and below ground.

Increased demands on the telecommunications industry, such as the advent of High-Bit-Rate Digital Subscriber Lines (HDSL), to meet the increasing needs of internet subscribers has resulted in the need to transfer more and stronger electrical signals over greater distances. One way of accomplishing this is to amplify the signals using electronic circuit cards deployed in environmentally protected housings. To meet the need for transferring stronger electrical signals over greater distances, electronic circuit cards having higher amplification capabilities, and thus greater heat dissipation rates, than the last generation of circuit cards of this type may be used. The need for more electrical signals of this type may be accommodated by placing as many of these higher-heat-dissipating circuit cards into a single environmentally protected housing as possible. However, existing housings configured to accommodate the heat loads of the last generation of electronic circuit cards cannot accommodate the increased heat load of larger numbers of higher-heat-dissipation electronic circuit cards.

For the reasons stated above, and for other reasons stated below which will become apparent to those skilled in the art upon reading and understanding the present specification, there is a need in the art for environmentally protected housings that can handle the increased heat load associated with increased numbers of higher-heat-dissipation electronic circuit cards and thereby maintain an acceptable operating temperature within the housing.

SUMMARY

The above-mentioned problems with existing housings configured to accommodate the heat loads of the last generation of electronic circuit cards being unable accommodate the increased heat load of larger numbers of higher-heat-dissipation electronic circuit cards and other problems are addressed by embodiments of the present invention and will be understood by reading and studying the following specification. Embodiments of the present invention provide a housing adapted to contain objects, for example electronic circuit cards; at least one case located within the housing, the case adapted to confine the objects to different locations within the housing, the case also thermally coupled to the objects; and at least one heat sink adapted to absorb heat from the case, the heat sink thermally coupled to the case and the housing.

More particularly, in a first embodiment, the housing has a partial-shell. The partial-shell has a multitude of fins on its exterior, an aperture, and a cover adapted to selectively seal the aperture against the weather and a pressure differential. The partial-shell has a base adapted to seal the partial-shell against the weather and a pressure differential. The partial-shell and the cover can be any material having a suitable combination of thermal properties, corrosion resistance, and strength, such as a formulation of aluminum, bronze, and nickel. The base can be any material having a suitable combination corrosion resistance and strength, such as nylon, plastic, such as ABS, or structural foam.

The case defines an object containment volume within the housing. The case has a frame that surrounds the object containment volume. The case has a first partition that divides the object containment volume two individual regions. The case has several second partitions that divide each region into several sections. Each of the second partitions is thermally coupled to the frame and to the first partition.

Each of the sections is divided into several slots. Each slot contains one of the objects. Each object is either thermally coupled to the frame, a second partition, and the first partition or to two second partitions and the first partition. The frame, the first partition, and the second partitions can be any material having suitable thermal properties, such as aluminum, copper bronze, brass, or the like.

The case is adapted to selective reconfiguration between operating and non-operating configurations. The non-operating configuration is defined by the second partitions of one of the regions being displaced relative to the second partitions of the other region. The operating configuration is defined by the second partitions of one of the regions being aligned with the second partitions of the other region.

At least one heat sink is thermally coupled to the case. The heat sink is a solid block and can be of any material suitable for heat sinks, such as aluminum, copper bronze, brass, or the like.

The first embodiment has a cage attached to the base. The cage is adapted to confine the case, including at least one heat sink thermally coupled thereto, to the base. The cage can be of any suitable material, such as plastic. In this configuration at least one heat sink extends through the cage. When the partial-shell is attached to the base with the cage, having at least one heat sink protruding therethrough, attached thereto, the heat sink protruding therethrough is thermally coupled to the partial-shell. The base has a lead-out, such as for wires used to input and output electrical signals to and from the objects. The lead-out is sealed against the weather and a pressure differential.

In a second embodiment, the housing has a pair of partial-shells. The partial shells are mated together to form a single-shell that has opposing first and second openings.

Each of the partial shells has a number of fins on its exterior. The partial-shells can be of a material equivalent to that of the partial shell of the first embodiment. The embodiment includes a case that can be structurally and functionally equivalent to the case of the first embodiment. The embodiment includes at least one heat sink thermally coupled to the case that can be functionally equivalent to the heat sink of the first embodiment. The case and the heat sink can be of materials equivalent to the case and heat sink of the first embodiment, respectively.

The second embodiment has a cage that contains the case, including at least one heat sink thermally coupled thereto. The cage has continuous opposing first and second openings. The cage, including the case having at least one heat sink thermally coupled thereto, is contained between the partial shells, as mated together to form the single-shell. In this configuration, the first opening of the cage coincides with the first opening of the single shell and the second opening of the cage coincides with at least a portion of the second opening of the single shell.

The second embodiment has a first cover adapted to selectively simultaneously close the first opening in the single-shell and seal the first opening of the cage against the weather and a pressure differential. The second embodiment has a second cover adapted to simultaneously close at least a portion of the second opening in the single-shell and seal the second opening of the cage against the weather and a pressure differential.

The first cover can be of the same material as the partial-shells, or a suitable equivalent. The second cover can be the same material as the base of the first embodiment, or a suitable equivalent. The second cover has a lead-out, such as for wires used to input and output electrical signals to and from the objects. The lead-out is sealed against the weather and a pressure differential.

As configured, the cage contains the case so that at least one heat sink protrudes through one of its openings and so that the case and the objects contained therein are sealed against the weather and a pressure differential by the first and second covers. When the cage is contained between the partial shells, at least one heat sink is thermally coupled to one of the partial shells.

In a third embodiment, the housing has a shell. The interior of the shell is divided into a pair of compartments by a partition. The shell has a pair of first apertures, one for each compartment. The shell has a second aperture opposite the first apertures. The shell has a pair of first covers, each adapted to selectively seal one of the first apertures against the weather and a pressure differential. The shell has a second cover adapted to seal the second aperture against the weather and a pressure differential. The second cover has a lead-out for wires.

The shell also has at least one third aperture located in one of the compartments between and perpendicular to one of the first apertures and the second aperture. The shell also has at least one third cover, each third cover adapted to seal the third aperture against the weather and a pressure differential. The third cover has a number of fins on its exterior. A portion of the third cover can be thermally coupled to a portion of the shell.

The third embodiment includes at least one case that can be structurally and functionally equivalent to the case of the first embodiment. The case can be of the same material as the case of the first embodiment, or a suitable equivalent. The case is located in the compartment having the third aperture. The third embodiment includes at least one heat sink that can be functionally equivalent to the heat sink of the first embodiment. The heat sink can be of the same material as the heat sink of the first embodiment, or a suitable equivalent. The heat sink is thermally coupled to the interior of the third cover and to the case.

In another embodiment, the heat sink includes a phase-change material (PCM) that changes from a solid to a liquid and vice versa. In another embodiment, the heat sink includes a PCM that changes from a liquid to a vapor and vice versa. In another embodiment, the heat sink includes at least one heat pipe.

In manufacturing the first embodiment, a partial shell having a number of fins on its exterior and an aperture is formed. A cover is formed and used to selectively seal the aperture against the weather and a pressure differential. A base having a lead-out is formed.

A case adapted to confine the objects to different locations within the housing is formed. Forming the case involves forming a frame, a first partition, and a number of second partitions. The region within the frame is divided into two regions using the first partition, each region is divided into a number of sections using the second partitions, and a number of slots is formed in each of the sections. Thermal couplings between each of the second partitions, the frame, and the first partition are formed.

Manufacturing the case also involves adapting the case to be selectively reconfigured between a non-operating configuration and an operating configuration. The non-operating configuration includes the second partitions of one the regions being displaced relative to the second partitions of the other region. The operating configuration includes the second partitions of one of regions being aligned with the second partitions of the other region.

An object, such as an electronic circuit card, is either thermally coupled to the first partition, frame, and a second partition or to the first partition, frame, and two partitions by ensuring the case is in the non-operating configuration, inserting the object into one of the slots, and selectively reconfiguring the case into the operating configuration. A thermally conducting material, of the type specially manufactured for thermal contact situations, can be deployed between the mating surfaces of the thermal couplings.

At least one heat sink is formed using a solid block of material. The heat sink is thermally coupled to one of the frame walls. A cage is also formed and used to contain the case, including at least one heat sink coupled thereto, so that the heat sink protrudes though the cage.

Manufacturing the first embodiment also involves attaching the cage and its contents to the base, inserting the cage into the partial-shell to form a thermal coupling between at least one heat sink and the partial-shell, and using the base to seal the partial-shell against the weather and a pressure differential. Also involved is sealing the lead-out in the base against the weather and a pressure differential.

In manufacturing the second embodiment, two partial-shells are formed, each having a number of fins on its exterior. A case that can be functionally and structurally equivalent to the case of the first embodiment is formed. At least one heat sink is formed using a solid block of material and is thermally coupled to the case.

A cage having opposing continuous first and second openings is formed and is used to contain the case, including at least one heat sink coupled thereto, so that at least one heat sink protrudes through the cage. The partial-shells are mated together to form a single-shell about the cage that has first and second openings, the first opening being coincident with the first opening of the cage and at least a portion of the second opening being coincident with the second opening of the cage. Mating the partial-shells about the cage also forms a thermal coupling between at least one heat sink and at least one of the partial-shells.

A first cover is formed and is used to selectively simultaneously cover the first opening in the single-shell and seal the first opening in the cage against the weather and a pressure differential. A second cover having a lead-out, such as for wires, is formed and is used to simultaneously close at least a portion of the second opening in the single-shell and seal the second opening of the cage against the weather and a pressure differential. Sealing the second opening of the cage also involves sealing the lead-out against the weather and a pressure differential. Sealing the first and second openings of the cage also seals the case and the objects contained therein against the weather and a pressure differential.

In manufacturing the third embodiment, a shell is formed. The interior of the shell so formed is divided into a pair of compartments by a partition. The shell so formed has a pair of first apertures, one first aperture for each compartment, and a second aperture opposite the first apertures. The shell so formed has at least one third aperture located in one compartment between and perpendicular to one of the first apertures and the second aperture.

At least one case that can be structurally and functionally equivalent to the case of the first embodiment is formed. The case is positioned in the compartment having the third aperture. A pair of first covers is formed and each is used to selectively seal one of the first apertures against the weather and a pressure differential. A second cover having a lead out for wires is formed and used to seal the second aperture. Sealing the second aperture involves sealing the lead-out against the weather and a pressure differential.

At least one heat sink, structurally and functionally equivalent to the heat sink of the first embodiment, is formed. At least one third cover is formed. The third cover so formed has a number of fins on its exterior and can be of the same material as the partial shell and the cover of the first embodiment, or a suitable equivalent. The third cover is used to seal the third aperture against the weather and a pressure differential. The heat sink is thermally coupled to the case and the third cover. A portion of the third cover can be thermally coupled to the shell.

In manufacturing another embodiment, a heat sink is formed by configuring it to encapsulate a PCM that changes from a solid to a liquid and vice versa. In manufacturing another embodiment, a heat sink is formed by configuring it to encapsulate a PCM that changes from a liquid to a vapor and vice versa. In manufacturing another embodiment, a heat sink is formed to include at least one heat pipe.

BRIEF DESCRIPTION OF THE DRAWINGS

FIG. 11 is an exploded view demonstrating the third embodiment of the present invention.

FIG. 11a is cover 306 viewed along 11a–11a of FIG. 11.

DETAILED DESCRIPTION

In the following detailed description, reference is made to the accompanying drawings that form a part thereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
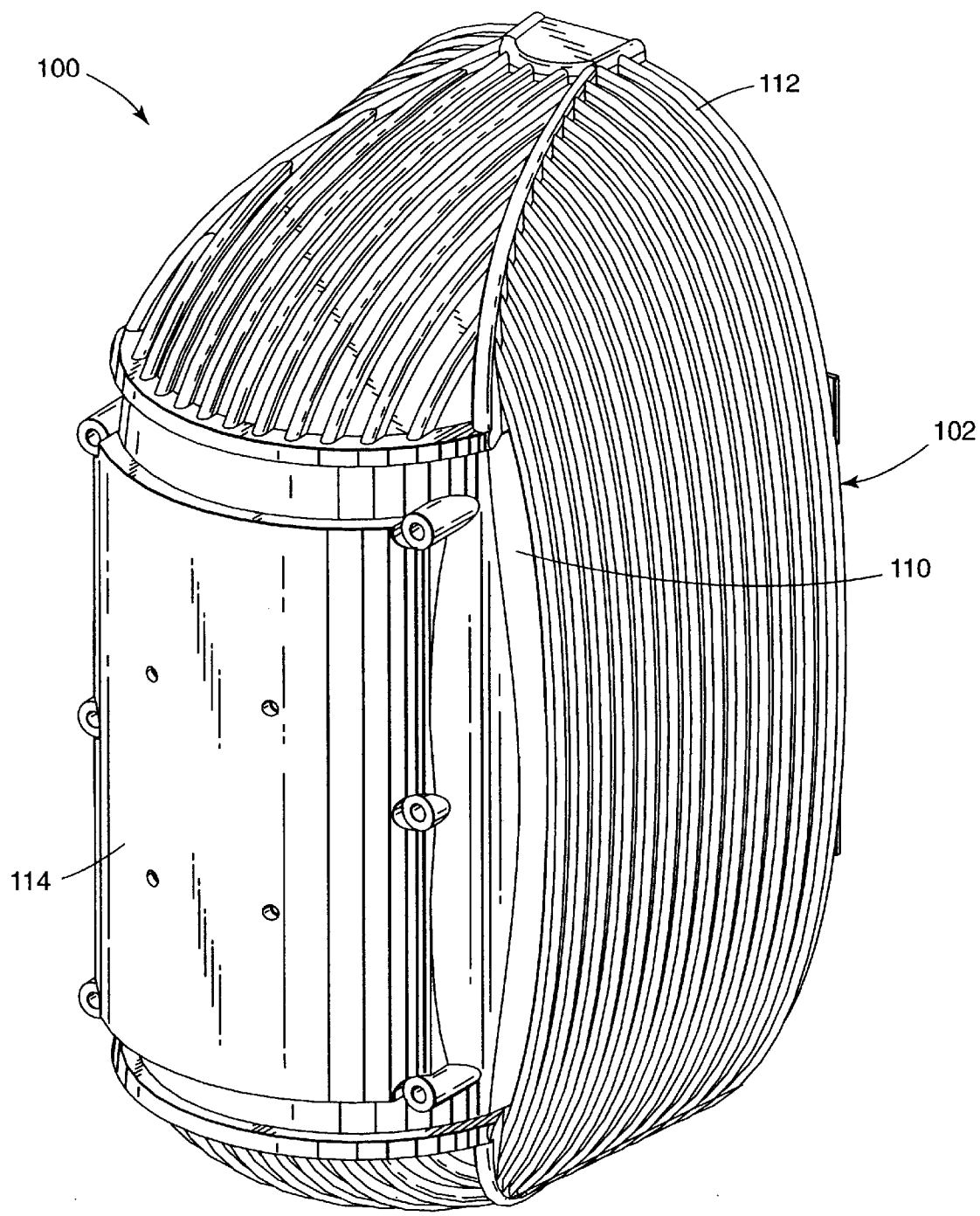
FIG. 1 is a perspective view demonstrating the first embodiment of the present invention as assembled.
Figure 2:
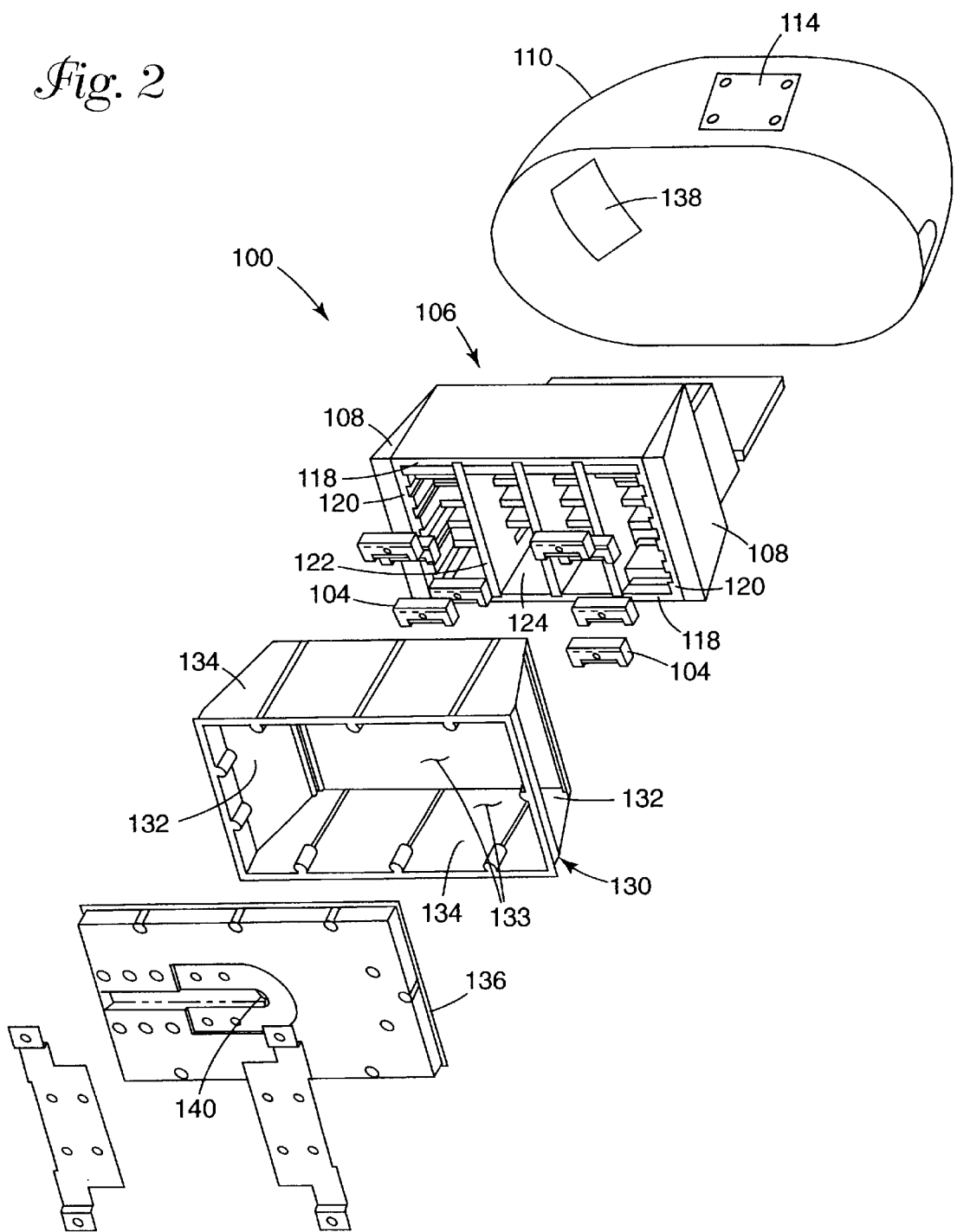
FIG. 2 is an exploded view demonstrating the first embodiment of the present invention.

Apparatus 100, shown in FIGS. 1–6, demonstrates a first embodiment of the present invention. Apparatus 100 has a housing, demonstrated by housing 102 in FIG. 1. Housing 102 is adapted to contain objects 104, shown in FIG. 2, such as electronic circuit cards. Apparatus 100 has case 106 contained within housing 102 that is adapted to confine objects 104 to different locations within housing 102, as demonstrated in FIG. 2. Case 106 is thermally coupled to each of objects 104. Apparatus 100 has at least one heat sink 108 adapted to absorb heat from case 106. The heat sink is thermally coupled to case 106 and to housing 102. In one embodiment, two heat sinks, as demonstrated by heat sinks 108 in FIG. 2, are used. In other embodiments, additional heat sinks are employed.

More specifically, housing 102 of apparatus 100 includes partial-shell 110, shown in FIGS. 1 and 2. Partial-shell 110 can have a number of fins, as exemplified by fin 112 in FIG. 1, distributed on its exterior. Partial-shell 110 has an aperture, which is covered by cover 114, as shown in FIGS. 1 and 2. Both partial-shell 110 and cover 114 can be of any material having a suitable combination of thermal properties, corrosion resistance, and strength, for example a formulation of aluminum, bronze, and nickel.

Cover 114 selectively seals housing 102 against the weather and a pressure differential. Selective sealing can be accomplished using any suitable method, for example using cap screws or a combination of threaded studs and nuts to compress a suitable gasket, such as a gasket that seals against the weather and a pressure differential, between cover 114 and partial-shell 110.

Figure 3:
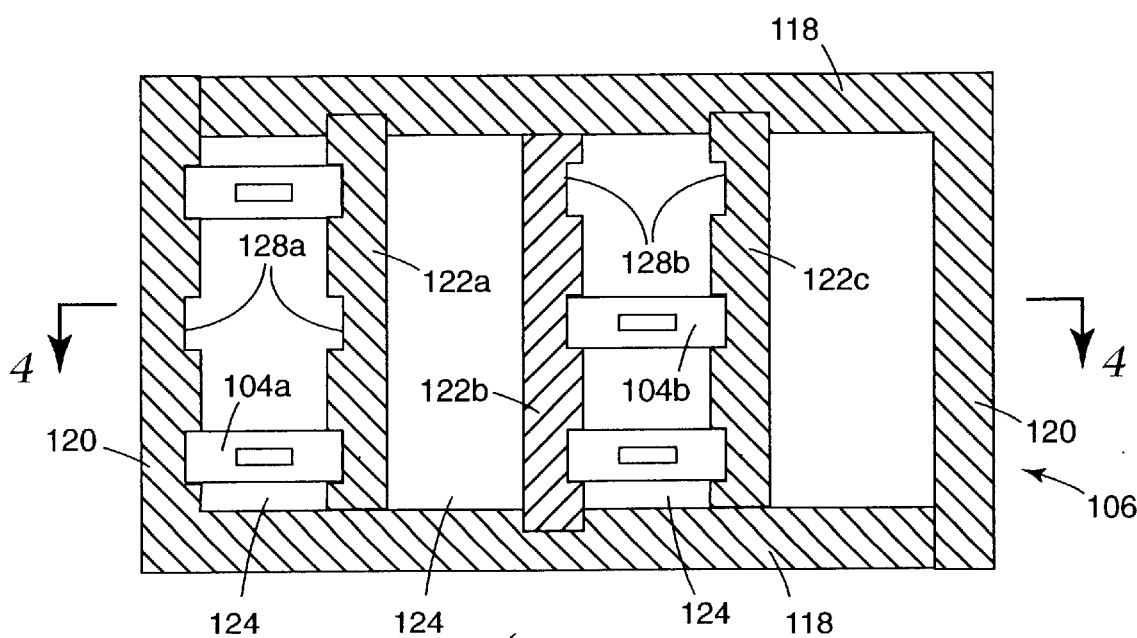
FIG. 3 is a cross-sectional view demonstrating the operating configuration of the case of the first embodiment of the present invention.

Case 106 has walls 118 and walls 120 that constitute a frame, as shown in FIGS. 2 and 3. Case 106 has several partitions that divide the region within case 106 into a several sections, as exemplified by partition 122 and section 124 in FIG. 2. Case 106 also includes partition 126, shown in FIG. 4, that divides the partitioned region within case 106 into two partitioned regions. Walls 118, walls 120, each partition 122, and partition 126 can be of any material having suitable thermal and strength properties, such as aluminum, copper, etc.

Figure 4:
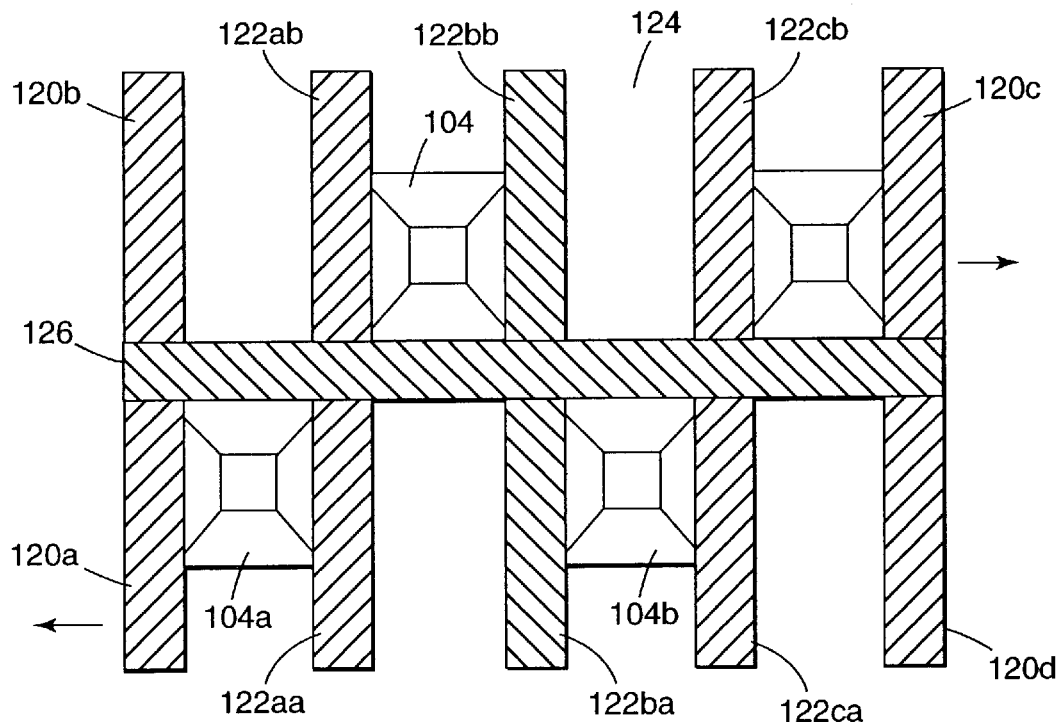
FIG. 4 demonstrates the operating configuration of the case of the first embodiment of the present invention as viewed along 4—4 of FIG. 3.

FIG. 4 demonstrates that partition 126 divides each wall 120 into two individual portions, demonstrated by wall portions 120a and b for one wall and by wall portions 120c and d for the other wall. Similarly, partition 126 divides each partition 122 into two portions, e.g., partitions 122a, b, and c of FIG. 3 are divided into partition-portions 122aa and 122ab, 122ba and 122bb, and 122ca and 122cb, respectively.

Each partition 122 is thermally coupled to the frame by establishing substantially void-free contact between each partition 122 and each of the walls 118, as demonstrated in FIG. 2 and by partitions 122a, b, and c of FIG. 3. Each partition 122 is similarly thermally coupled to partition 126, as demonstrated by partition-portions 122aa, 122ab, 122ba, 122bb, 122ca, and 122cb in FIG. 4. Substantially void-free contact can be accomplished using any suitable method, such as by polishing or disposing a thermally conducting material between the mating surfaces of walls 118 and each partition 122 and maintaining forced contact between the mating surfaces using any suitable method, such as by clamping, using a resilient material, by wedging, or the like. The thermally conducting material can be of the type specially manufactured for thermal contact situations such as this.

Each section 124 is divided into several slots, as exemplified by slots 128a and b in FIG. 3. As demonstrated by slot 128a in FIG. 3, a slot can include one groove in one of walls 120 and an opposite groove in the neighboring partition, as exemplified by partition 122a. As demonstrated by slot 128b in FIG. 3, a slot can also include opposing slots in neighboring partitions, as exemplified by partitions 122b and c. Each slot can contain an object 104, such as an electronic circuit card. As demonstrated by object 104a in FIGS. 3 and 4, an object can be thermally coupled to a wall 120, a neighboring partition, as exemplified by 122a, and partition 126. As demonstrated by object 104b in FIGS. 3 and 4, an object can also be thermally coupled to two neighboring partitions, as exemplified by partitions 122b and c, and partition 126.

Figure 6:
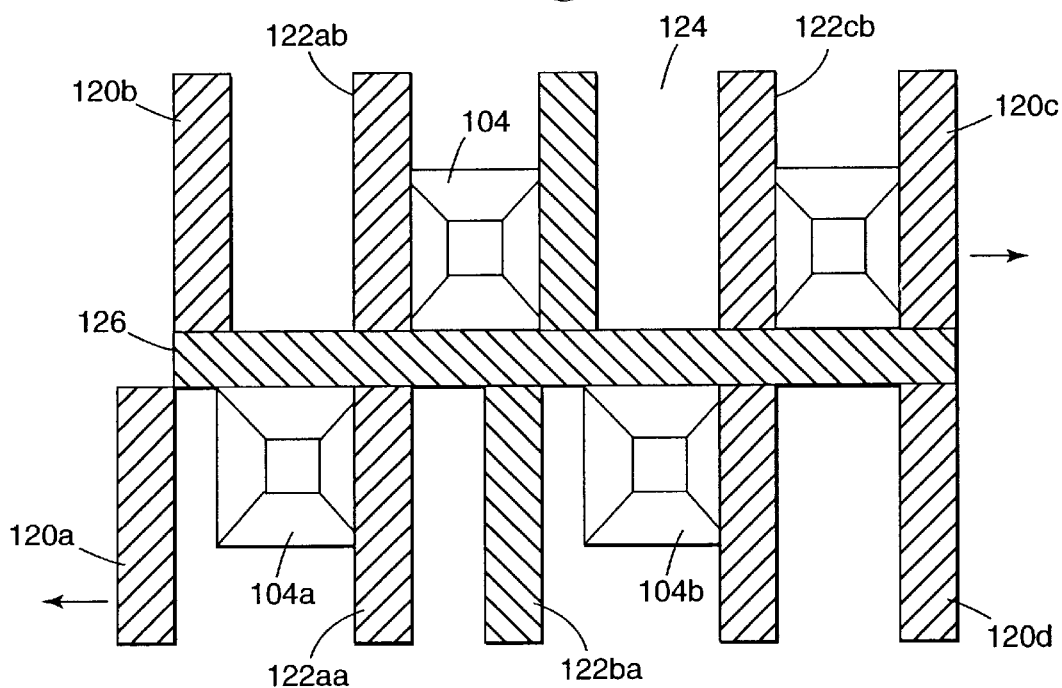
FIG. 6 demonstrates the non-operating configuration of the case of the first embodiment of the present invention as viewed along 6—6 of FIG. 5.
Figure 5:
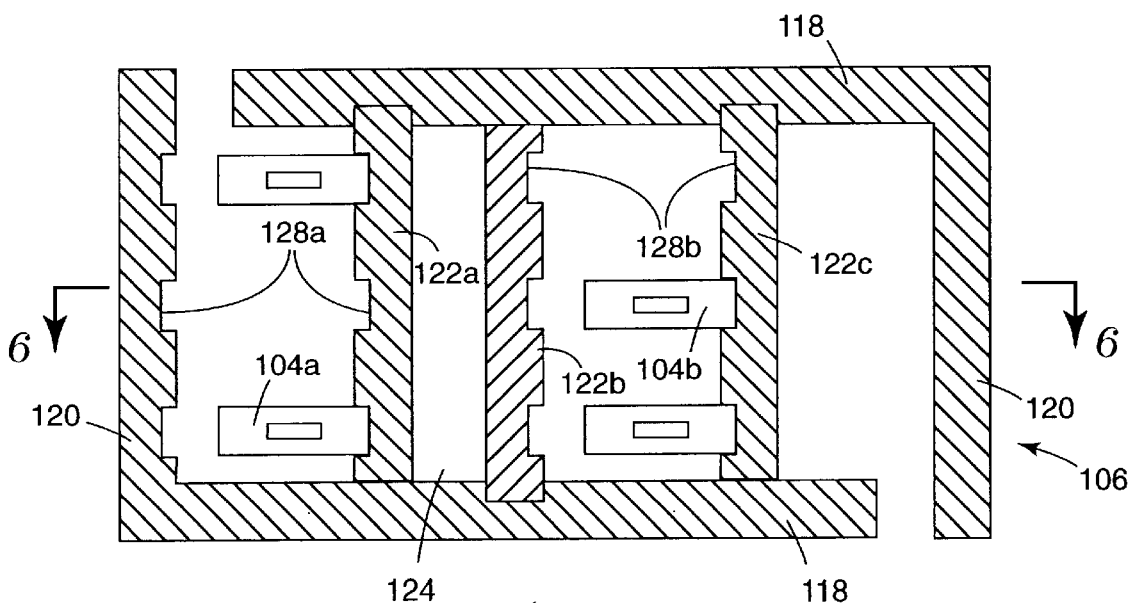
FIG. 5 is a cross-sectional view demonstrating the non-operating configuration of the case of the first embodiment of the present invention.

The configuration demonstrated in FIGS. 3 and 4 corresponds to an operating configuration. The configuration of case 106 can be selectively reconfigured between the operating configuration and a non-operating configuration, demonstrated in FIGS. 5 and 6. The non-operating configuration involves a portion, such as wall portion 120a in FIG. 6, of at least one of the walls 120 and alternating partition portions, demonstrated by partition portion 122ba, being displaced relative to the objects, as exemplified by objects 104a and b. FIG. 6 demonstrates that wall portion 120a is displaced relative to wall portion 120b and partition-portion 122ba is displaced relative to partition-portion 122bb.

Selectively reconfiguring case 106 from the operating to the non-operating configuration facilitates the insertion and removal of objects 104. Selectively reconfiguring case 106 from the non-operating to the operating configuration secures each object 104 in place to form one of the thermal couplings described above. A thermally conducting material, of the type specially manufactured for thermal contact situations, can be deployed between the mating surfaces. Selectively reconfiguring case 106 from the operating to the non-operating configuration can also involve the other side of partition 126, e.g., wall portion 120c and partition-portion 122bb being displaced relative to wall portion 120d and partition-portion 122ba, respectively.

At least one heat sink 108 is thermally coupled to case 106, but two heat sinks 108 can be thermally coupled to opposing frame-walls, e.g., to walls 120, as demonstrated in FIG. 2. Alternatively, at least one heat sink can be thermally coupled to each of the walls 118 and each of the walls 120. Heat sink 108 is a solid block of material having thermal properties suitable for heat sinks, such as aluminum, copper, brass, bronze, or the like.

A thermal coupling can be established between a heat sink 108 and any of the walls of case 106 by brazing or using a thermally conductive epoxy. Polishing the respective contact surfaces or disposing a thermally conducting material between the respective contact surfaces and screwing the respective heat sink to the respective wall can also be used to establish a thermal coupling between a heat sink 108 and any of the walls of case 106.

Apparatus 100 has cage 130 adapted to contain case 106 therein. Cage 130 has openings 132 and openings 133 perpendicular to openings 132, as shown in FIG. 2. Cage 130 has a pair of continuous walls 134. When case 106 is contained within cage 130, at least one heat sink 108, as thermally coupled to a respective wall 120 of case 106, protrudes through the respective opening 132. In the alternative where each of the walls 118 of case 106 can also have at least one heat sink 108 thermally coupled thereto, each of the walls 134 of cage 130 can also have openings so that the respective heat sinks 108 protrude through these openings. Cage 130 can be of any suitable material, such as plastic.

Apparatus 100 has base 136 adapted to attach cage 130, containing case 106 therein, thereto. Base 136 is also adapted to attach partial shell 110 thereto. Base 136 can be any material having suitable corrosion resistance and strength, such as nylon, plastic, such as ABS, or structural foam. In one embodiment, base 136 comprises a cable head assembly constructed as taught and described in co-pending application Ser. No. 09/804,106 entitled CABLE HEAD ASSEMBLY and filed on even date herewith, which application is incorporated herein by reference.

Selectively sealing the aperture in partial-shell 110 using cover 114 and attaching partial-shell 110 to base 136 closes partial-shell 110 to form housing 102 that contains cage 130, containing case 106 therein. In this configuration, at least one heat sink 108 forcibly abuts a corresponding thermally conducting pad, demonstrated by thermally conducting pad 138 in FIG. 2, that is thermally coupled to the interior of partial-shell 110. Thermally conducting pad 138 can be of any material having suitable thermal properties, such as aluminum, copper, etc.

Thermal coupling between a thermally conducting pad 138 and a heat sink 108 can be enhanced by polishing the respective contact surfaces or by disposing a thermally conducting material between the respective contact surfaces. Thermal coupling of thermally conducting pad 138 to the interior of partial-shell 110 can be accomplished by molding, brazing, or epoxying, using a suitable thermally conductive epoxy. Polishing the respective contact surfaces or disposing a thermally conducting material between them and screwing thermally conducting pad 138 to the interior of partial-shell 110 can also be used to thermally couple thermally conducting pad 138 to the interior of partial-shell 110.

Cage 130 can be attached to base 136 using any suitable method, such as cap screws, nuts and bolts, or a threadedstud-and-nut arrangement. Base 136 seals housing 102 against the weather and a pressure differential. Sealing can be accomplished using any suitable sealing method, such as compressing a gasket between base 136 and partial shell 110. Any suitable gasket can be used, such as a gasket of a type employed by the automotive industry for engine-head gaskets. The gasket can be silicone or a suitable equivalent. Compression of the gasket between base 136 and partial shell 110 can be accomplished using any suitable method, such as cap screws or a threaded-stud-and-nut arrangement.

Base 136 can include lead-out 140, such as for wires used to input and output electrical signals to and from objects 104. Lead-out 140 can be sealed against the weather and a pressure differential using any suitable material, such as a suitable elastomer. Apparatus 100 can be fitted with a pressure relief valve to guard against excessive external-to-internal pressure differences.

Figure 7:
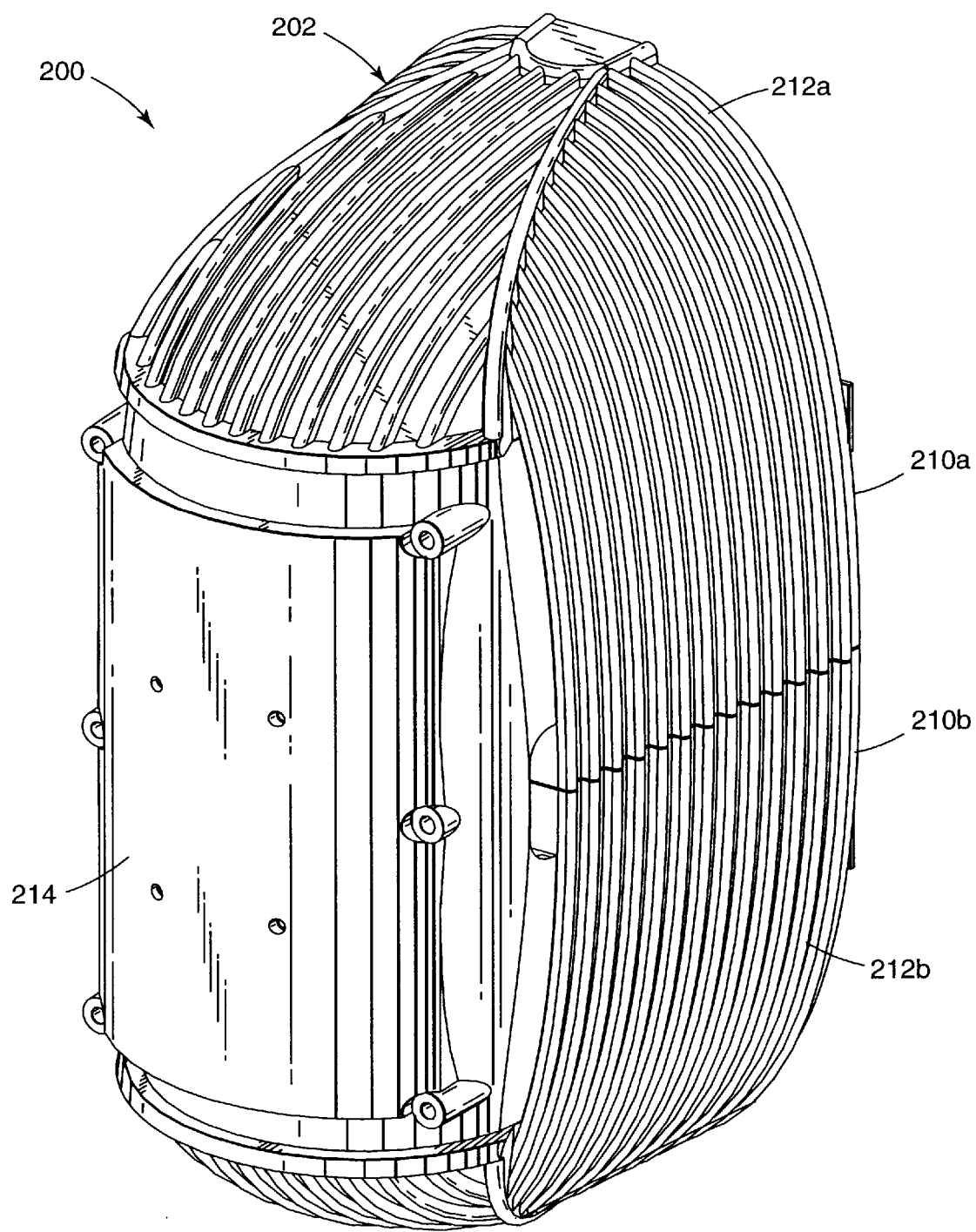
FIG. 7 is a perspective view demonstrating the second embodiment of the present invention as assembled.
Figure 8:
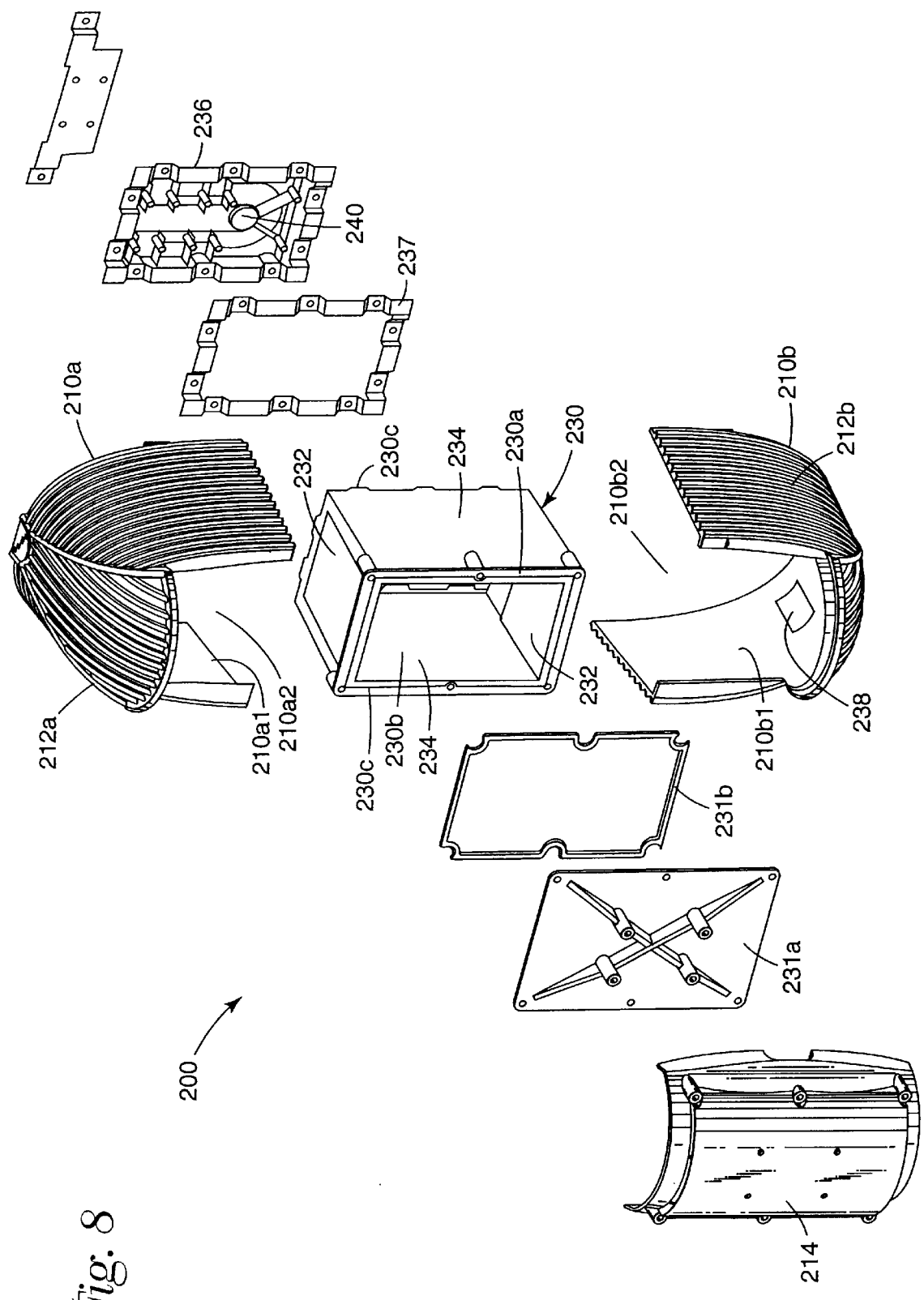
FIG. 8 is an exploded view demonstrating the second embodiment of the present invention.
Figure 9:
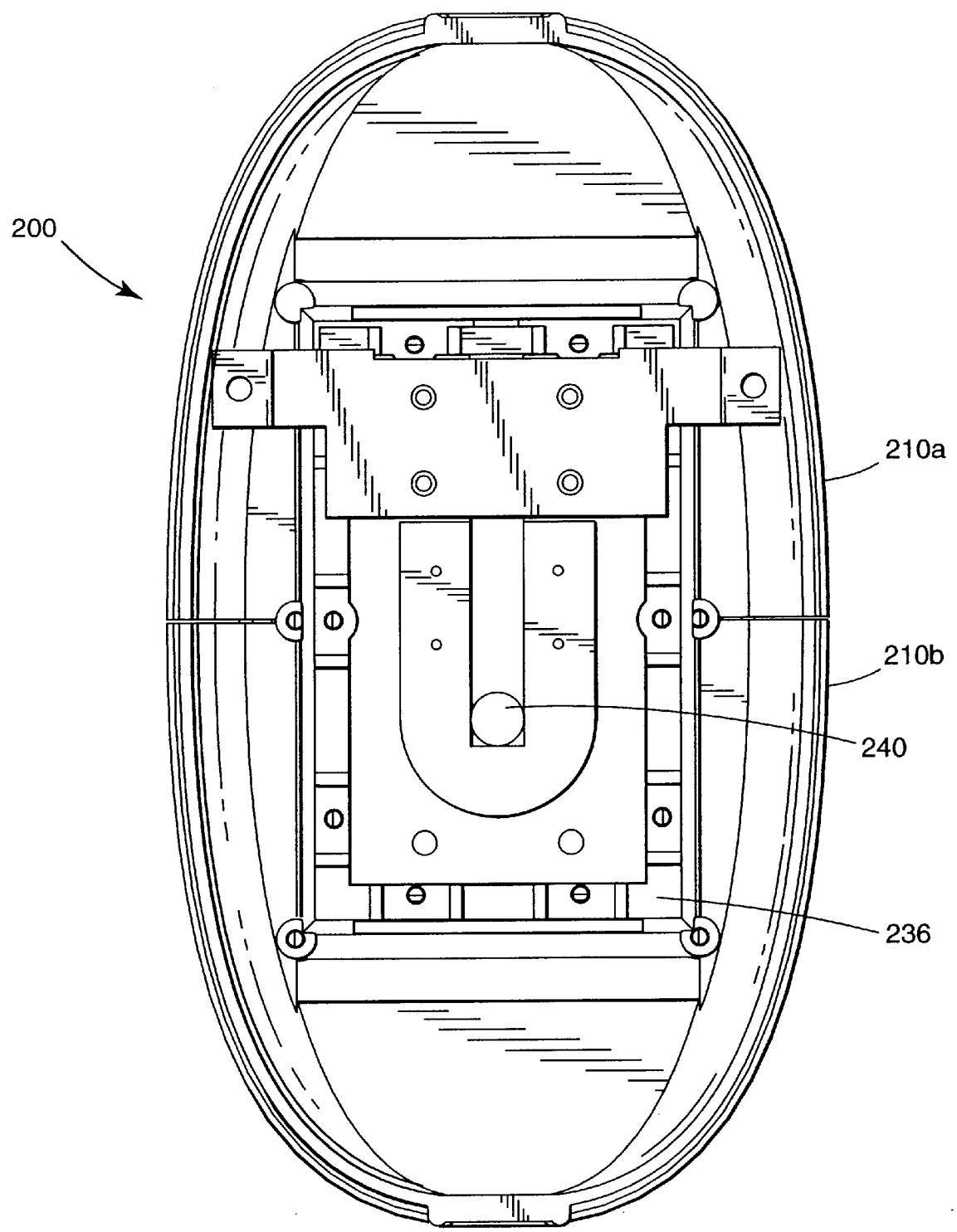
FIG. 9 is a back elevation view demonstrating the second embodiment of the present invention.

Apparatus 200, shown in FIGS. 7–9, demonstrates a second embodiment of the present invention. Apparatus 200 has housing 202, exemplified in FIG. 7 for containing objects, such as electronic circuit cards. Apparatus 200 has a case disposed within housing 202 that is adapted to confine the objects to different locations within the housing. In one embodiment, the case is structurally and functionally equivalent to case 106 described above and exemplified in FIGS. 2–6 for apparatus 100. In one embodiment, the case is of the same material as case 106, or a suitable equivalent. Apparatus 200 has at least one heat sink thermally coupled to the case and to housing 202. In one embodiment, apparatus 200 has two heat sinks, as demonstrated by heat sinks 108 in FIG. 2 for apparatus 100, or more. In one embodiment, the heat sink can functionally equivalent to heat sink 108. In one embodiment, the heat sink can be of the same material as heat sink 108, or a suitable equivalent.

Apparatus 200 has partial-shells 210a and b. Partial-shell 210a has opposing openings 210a1 and a2 and partial shell 210b has opposing openings 210b1 and b2, as shown in FIG. 8. Partial shells 210a and b have a number of fins, demonstrated by fins 212a and b, respectively, on their exteriors. Partial-shells 210a can be of any material having a suitable combination of thermal properties, corrosion resistance, and strength, for example a formulation of aluminum, bronze, and nickel.

Apparatus 200 has cage 230 adapted to contain the case, including at least one heat sink. The heat sink protrudes through one of the openings 232, shown in FIG. 8, of cage 230, but an additional heat sink can protrude through the other opening 232. Cage 230 can include flange 230a that frames opening 230b, an opening opposite opening 230b that is framed by flange 230c, and a pair of walls, as demonstrated by walls 234 in FIG. 8. Each of the walls 234 can have openings therein so that additional heat sinks thermally coupled to the case can protrude therethrough. Cage 230 can be of plastic or a suitable equivalent.

Partial-shells 210a and b are butted together to form a single-shell about cage 230 that has opposing first and second openings comprising openings 210a1 and b1 and 210a2 and b2, respectively. The first and second openings are coincident with opening 230b and the opening framed by flange 230c, respectively. When partial-shells 210a and b are butted together, the abutment can be sealed against the weather and pressure differential using a suitable material. The sealing material can be of a thermal conductivity sufficient to thermally couple partial-shells 210a and b. Cap screws, nuts and bolts, a threaded-stud-and-nut arrangement, or a suitable equivalent can be used to compress the sealing material between partial-shells 210a and b and to hold partial-shells 210a and b together.

When partial-shells 210a and b are butted together to form a single-shell about cage 230, at least one heat sink protruding through an opening 232 in cage 230 can abut a corresponding thermally conducting pad 238, shown in FIG. 8. Thermally conducting pad 238 can be of any material having suitable thermal properties, such as aluminum, copper, etc. There can be at least one thermally conducting pad 238 thermally coupled to partial shells 210a and b, respectively.

Thermal coupling of thermally conducting pad 238 to partial-shells 210a and b can be accomplished by molding, brazing, or epoxying, using a suitable thermally conductive epoxy. Polishing the respective contact surfaces or disposing a thermally conducting material between them and screwing thermally conducting pad 238 to partial-shells 210a and b can also be used to thermally couple thermally conducting pad 238 to the interior of partial-shells 210a and b.

Apparatus 200 has cover 214 that simultaneously selectively covers the first opening in the single-shell and seals opening 230b of cage 230 against the weather and a pressure differential. Cover 214 can be of any material having a suitable combination of thermal properties, corrosion resistance, and strength, for example a formulation of aluminum, bronze, and nickel. Selective sealing of opening 230b, using cover 214, can be accomplished by compressing a suitable gasket, such as a gasket that seals against the weather and a pressure differential, between cover 214 and flange 230a of cage 230, but two gaskets, as demonstrated by gaskets 231a and b in FIG. 8, can be used. Any suitable method can be used to compress the gasket between cover 214 and flange 230a, such as cap screws or a threaded-stud-and-nut arrangement. Gaskets 231a and b can be of any suitable material, such as silicone, rubber, or the like.

In one embodiment, gasket 231b is embedded in groove 230c. Groove 230c is formed in flange 230a of cage 230, as shown in FIG. 8.

In another embodiment, apparatus 200 has cover 214 that simultaneously selectively covers the first opening in the single-shell and seals opening 230b of cage 230 against the weather and a pressure differential. Cover 214 can be of any material having a suitable combination of thermal properties, corrosion resistance, and strength, for example a formulation of aluminum, bronze, and nickel. In one embodiment, selective sealing of opening 230b, using cover 214, is accomplished by compressing a suitable gasket, such as gasket 231b that seals against the weather and a pressure differential, between cover 214 and flange 230a of cage 230. Any suitable method can be used to compress gasket 231b between cover 214 and flange 230a, such as cap screws, a threaded-stud-and-nut arrangement, or the like. Gasket 231b can be of any suitable material, such as silicone, rubber, or the like.

In this embodiment, heat sink 231a is sandwiched between the case and cover 214 to thermally couple them. Heat sink 231a is any material or combination of materials having thermal properties suitable for heat sinks, such as aluminum, copper, brass, bronze, or the like. In one embodiment, a thermal coupling is established between heat sink 231a and cover 214 while compressing gasket 231b between cover 214 and flange 230a, i.e., heat sink 231a is brought into forced contact with cover 214 and the case using cap screws, a threaded-stud-and-nut arrangement, or the like. In one embodiment, a thermally conducting material is disposed between heat sink 231a and cover 214 and between heat sink 231a and the case. In another embodiment, heat sink 231a is brazed, screwed, bolted, epoxied, using a thermally conductive epoxy, or the like to the case and cover 214 is brought into forced contact with heat sink 231a using cap screws, a threaded-stud-and-nut arrangement, or the like, while compressing gasket 231b between cover 214 and flange 230a. In another embodiment, heat sink 231a is brazed, screwed, bolted, epoxied, using a thermally conductive epoxy, or the like to cover 214 and is brought into forced contact with the case using cap screws, a threaded-stud-and-nut arrangement, or the like, while compressing gasket 231b between cover 214 and flange 230a.

In operation, heat sink 231a absorbs heat dissipated by the objects, e.g. objects 104 of FIG. 2, confined within the case, as follows: the heat dissipated by the objects is transferred to the case via thermal contact between the objects and the case, and the heat transferred to the case is absorbed by heat sink 231 a via thermal contact between the case and heat sink 231a. The heat absorbed by heat sink 231a is transferred to cover 214 via thermal contact between heat sink 231a and cover 214 and is subsequently transferred exteriorly of cover 214.

Apparatus 200 has cover 236. In one embodiment, cover 236 comprises a cable head assembly constructed as taught and described in co-pending application Ser. No. 09/804,106 entitled CABLE HEAD ASSEMBLY and filed on even date herewith, which application is incorporated herein by reference.

Cover 236 can be any material having suitable corrosion resistance and strength, such as nylon, plastic, such as ABS, or structural foam. Cover 236 simultaneously covers the second opening in the single-shell and seals the opening framed by flange 230c of cage 230 against the weather and a pressure differential. Sealing the opening framed by flange 230c of cage 230 using cover 236 can be accomplished by compressing a suitable gasket, as demonstrated by gasket 237, between cover 236 and flange 230c using any suitable method, such as cap screws or a threaded-stud-and-nut arrangement. Gasket 237 can be of the type employed by the automotive industry for engine-head gaskets and can be of silicone or a suitable equivalent. In one embodiment, gasket 237 is embedded in cover 236. FIG. 9 is a back view of apparatus 200 demonstrating cover 236 simultaneously covering the second opening in the single-shell and sealing the opening framed by flange 230c of cage 230 against the weather and a pressure differential.

Cover 236 includes lead-out 240 such as for wires used to input and output electrical signals to and from the objects. Lead-out 240 can be sealed against the weather and a pressure differential using any suitable material, such as a suitable elastomer.

When cage 230 contains the case containing the objects and including at least one heat sink protruding through one of its openings 232 and when opening 230b and the opening framed by flange 230c are sealed by covers 214 and 236, respectively, the objects are sealed against a pressure differential and the weather. The sealed case can be fitted with a pressure-relief valve to guard against excessive external-to-internal pressure differences.

Figure 10:
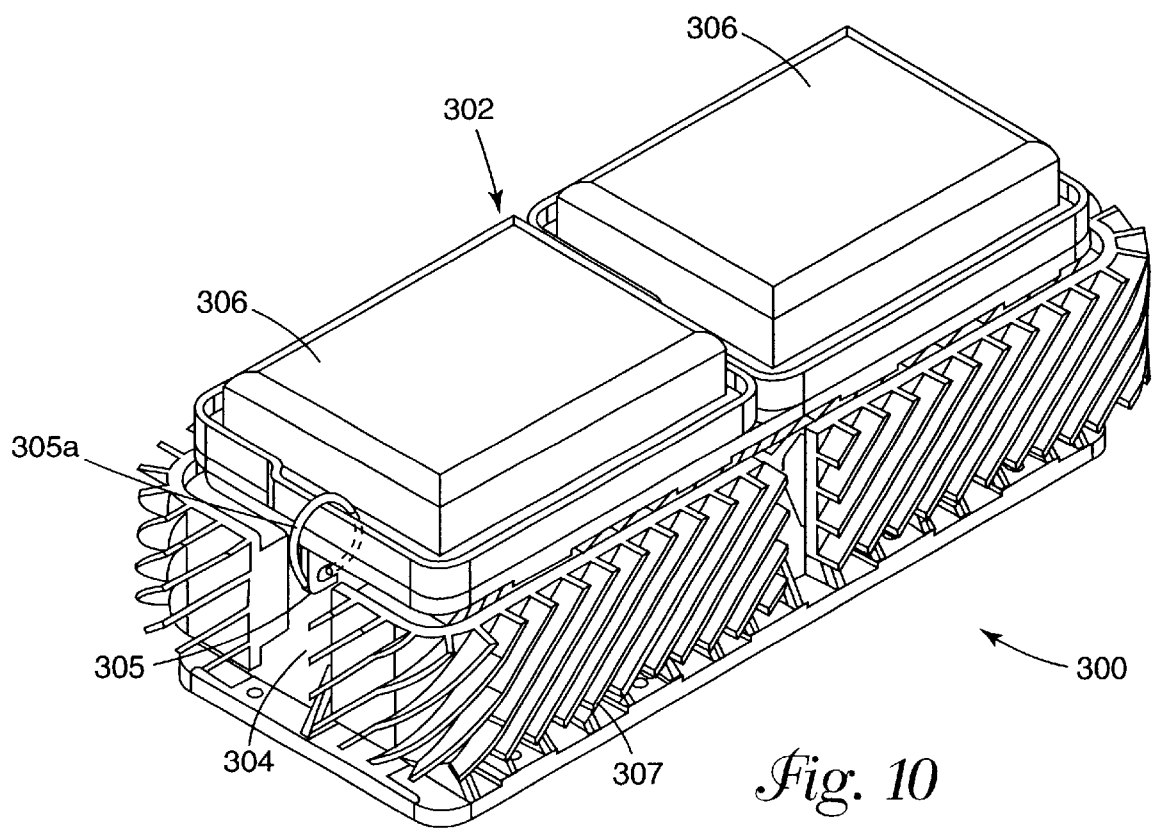
FIG. 10 is a perspective view demonstrating the third embodiment of the present invention as assembled.

Apparatus 300, shown in FIGS. 10 and 11, demonstrates a third embodiment of the present invention. FIG. 10 demonstrates that apparatus 300 has housing 302 that can be used for containing objects, such as electronic circuit cards. Housing 302 includes shell 304 that is sealed against the weather and a pressure differential by a pair of first covers 306 and a second cover (not shown) opposite first covers 306. Shell 304 can have a number of fins, as exemplified by fin 307 in FIG. 10, distributed on its exterior.

Shell 304 includes protrusion 305 on each of its ends having an aperture therethrough. In another embodiment, protrusion 305 is a lug. A tether 305a passes through the aperture of each protrusion 305 and through an aperture (not shown) in each of covers 306 to form a loop that interconnects each protrusion 305 to one of covers 306. Tether 305a can be of any material of suitable tensile strength and corrosion resistance, such as an aramid, e.g., Kevlar, or the like. In another embodiment, tether 305a has two ends, and the respective ends of a tether 305a are connected to a cover 306 and an end of shell 304 using any suitable method, such as screwing, gluing, riveting, or the like.

In particular, as demonstrated in FIG. 11, shell 304 is divided into two compartments, such as compartment 308, by partition 310. Shell 304 has a pair of first apertures, such as aperture 312, one for each compartment. Each aperture 312 is selectively sealed against the weather and a pressure differential by one of covers 306. Shell 304 and covers 306 can be of any material having a suitable combination of thermal properties, corrosion resistance, and strength, for example a formulation of aluminum, bronze, and nickel, nylon, ABS, or the like.

Selective sealing of the respective apertures, using covers 306, can accomplished using any suitable method, for example cap screws, nuts-and-bolts, or a combination of threaded studs and nuts, to compress a suitable gasket, such as a gasket that seals against the weather and a pressure differential, between the respective cover 306 and shell 304. FIG. 11a illustrates one embodiment of a bottom view of cover 306. Embedded gasket 306a can be any suitable material that seals against the weather and a pressure differential, such as silicone, rubber, or the like.

Shell 304 has a second aperture opposite covers 306, sealed by the second cover against the weather and a pressure differential. The second cover can include a lead-out. The second cover can be any material having suitable corrosion resistance and strength, such as nylon, plastic, ABS, or structural foam. Sealing of the second aperture using the second cover can be accomplished using any suitable sealing method, such as compressing a gasket between the second cover and shell 304. Any suitable gasket can be used, such as a gasket of type employed by the automotive industry for engine-head gaskets that can be of silicone or an equivalent material. Compression of the gasket between the second cover and shell 304 can be accomplished using any suitable method, such as cap screws, nuts-and-bolts, or a threaded-stud-and-nut arrangement.

The shell 304 has at least one third aperture 314 located in one of the compartments between and perpendicular to first aperture 312 and the second aperture. There can be a pair opposing apertures 314 in each compartment, as demonstrated for compartment 308 in FIG. 11, however. The shell also has at least one third cover 316, shown in FIG. 11. Cover 316 is adapted to seal aperture 314 against the weather and a pressure differential. Cover 316 has a number of fins, as exemplified by fin 307, on its exterior and a heat sink, as exemplified by heat sink 320, thermally coupled to its interior. In one embodiment, heat sink 320 is functionally equivalent to heat sink 108 of apparatus 100. In one embodiment, heat sink 320 can be of the same material as heat sink 108, or a suitable equivalent. Portion 322 of cover 316 can be thermally coupled to a portion of the shell, as demonstrated in FIG. 11. In the configuration where there can be a pair opposing apertures 314 in each compartment, each aperture is sealed against the weather and a pressure differential by a cover 316, as demonstrated in FIG. 11.

The third embodiment includes at least one case 324, shown in FIG. 11. In one embodiment, case 324 is structurally and functionally equivalent to case 106 of the first embodiment. In one embodiment, case 324 is of the same material as case 106, or a suitable equivalent. As demonstrated in FIG. 11, a case 324 can be located in each compartment. When aperture 314 is sealed against the weather and a pressure differential by cover 316, heat sink 320 extends through aperture 314 and is thermally coupled to case 324.

In an alternative embodiment, the case can be as demonstrated by case 400 in FIGS. 12–16. Case 400 is disposed within a housing and is adapted to confine objects 401, such as electronic circuit cards, at different locations within the housing. Case 400 has walls 402 and walls 404 that constitute frame 406, demonstrated in FIG. 13. Case 400 has at least one partition 408 that divides the region within it into at least two regions. Case 400 has several partitions 410-1 to 410-N and at least one partition 412 that divide each of the two regions into several sections. Walls 402, walls 404, each of partitions 410-1 to 410-N, and partition 408 can be of any material having suitable thermal and strength properties, such as aluminum, copper, etc.

Walls 402 are thermally coupled to walls 404. Partitions 410-1 to 410-N and partition 412 are thermally coupled to walls 404. Partition 408 is thermally coupled to walls 402. Thermal contact can be accomplished using any suitable method, such as by polishing or disposing a thermally conducting material between the contact surfaces and maintaining forced contact between the mating surfaces using any suitable method, such as by using a resilient material or by wedging as described below. The thermally conducting material can be of the type specially manufactured for thermal contact situations such as this.

Frame 406 has at least one slot 414 adapted to accommodate partition 408. Slot 414 includes a pair of opposing grooves 414a and b as shown. Frame 406 has several slots 416-1 to 416-M, each adapted to accommodate one of partitions 410-1 to 410-N. Each of slots 416-1 to 416-M respectively includes a pair of opposing grooves 416-1a and 416-1b to 416-Ma to 416-Mb as shown. Frame 406 has at least one slot 418 adapted to accommodate partition 412. Slot 418 includes a pair of opposing grooves 418a and b as shown.

Figure 12:
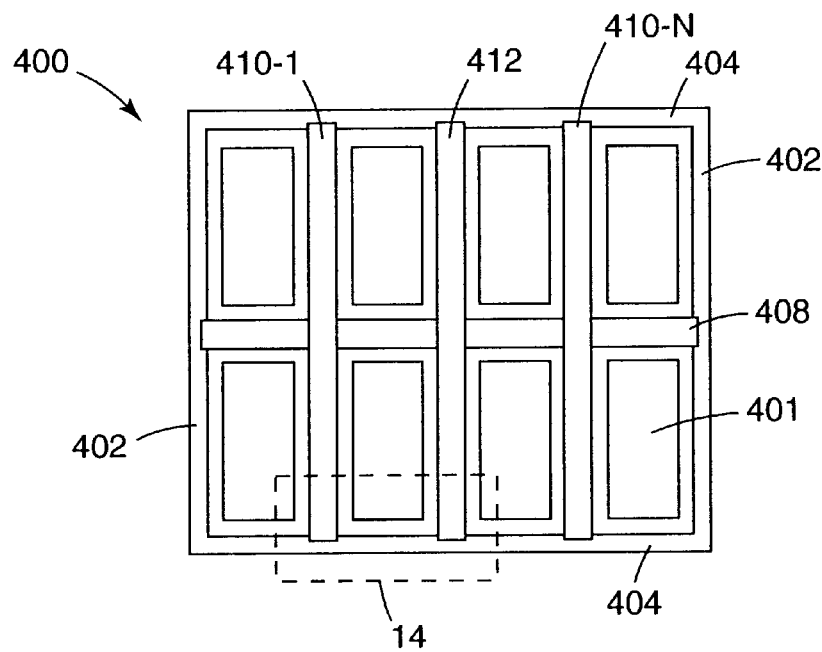
FIGS. 12, 13, 14, 15, and 16 illustrate an alternative embodiment of a case according to the teachings of the present invention.
Figure 13:
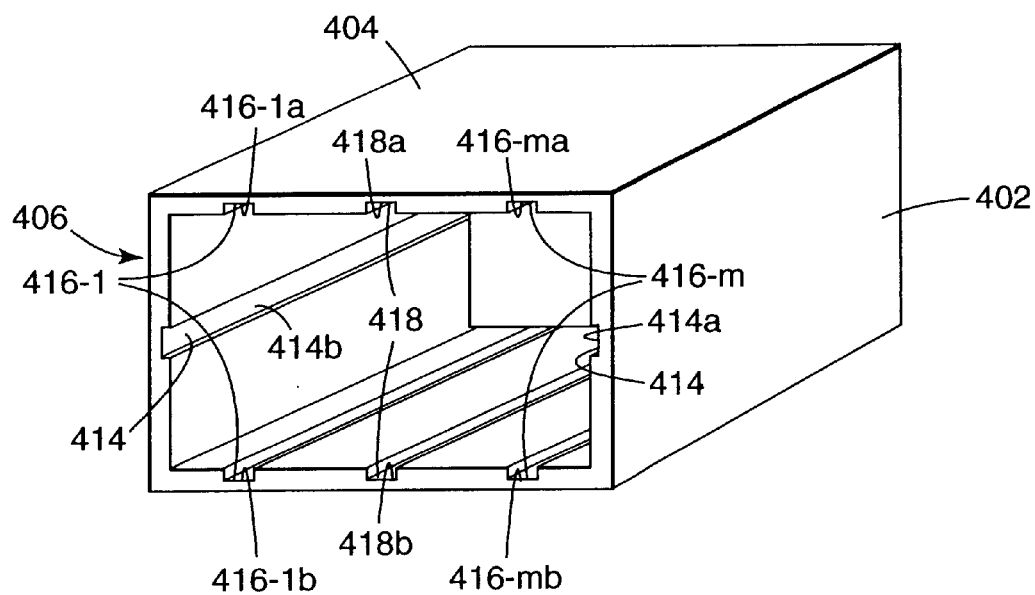
Figure 14:
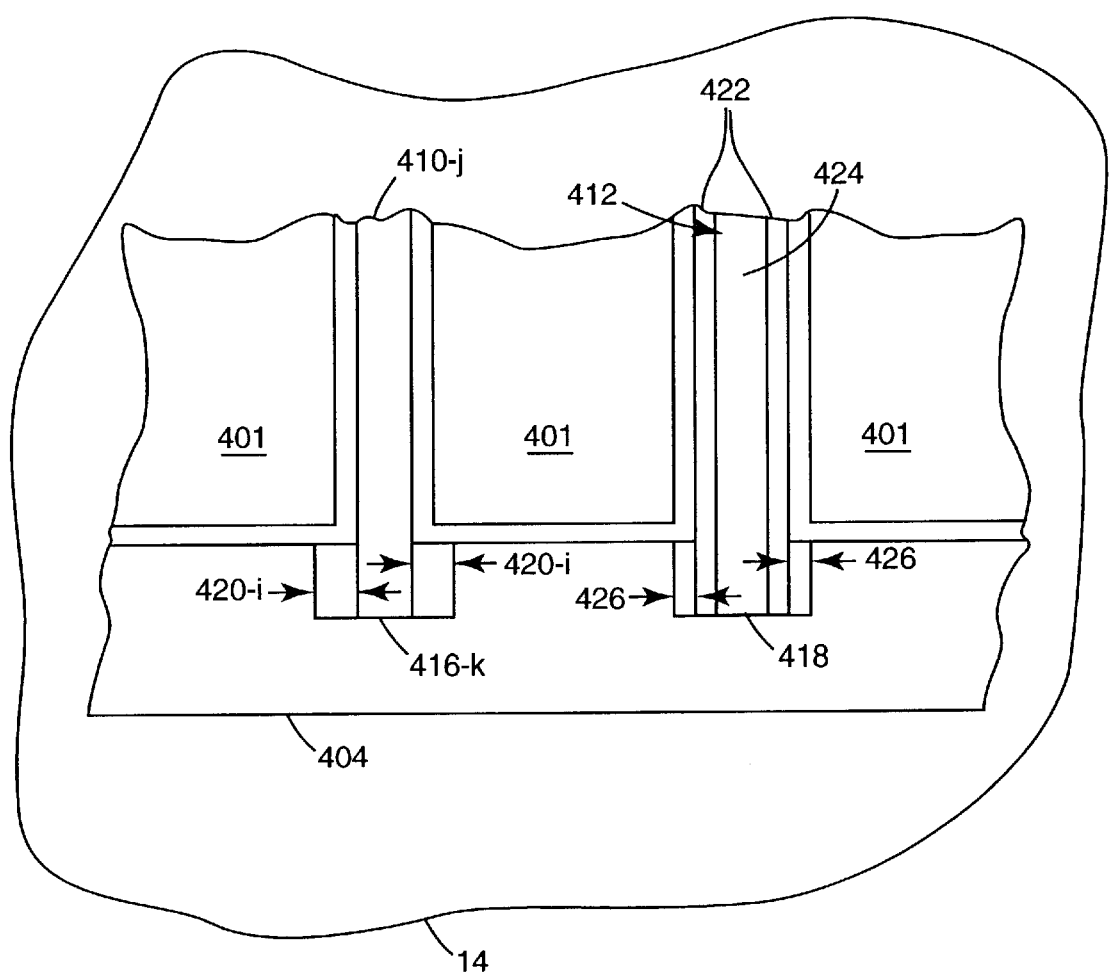

FIG. 14 is an enlarged view of encircled region 14 of FIG. 12 and demonstrates one embodiment case 400. Partition 410-j of FIG. 14 is any one of partitions 410-1 to 410-N. Slot 416-k is any one of slots 416-1 to 416-M. Slot 416-k is adapted to provide a clearance gap 420-i on either side of partition 410-j. This demonstrates that each of slots 416-1 to 416-M is adapted to provide clearance gap on either of its sides. Partition 412 is composite configuration that includes a pair of outer layers 422. Outer layers 422 sandwich resilient layer 424 between them. Layers 422 can be of any material having suitable thermal and strength properties, such as aluminum, copper, etc. Layer 424 can be any material having suitable resilience properties, such as a suitable elastomeric gasket. Slot 418 is adapted to provide a clearance gap 426 on either side of partition 412.

Resilient layer 424 exerts a force on each of layers 422, which in turn bear against and transmit the force to adjacent objects 401, as facilitated by clearance gaps 426. In turn, an object 401 bears against an adjacent partition 410-j, which transmits the force, as facilitated by their respective clearance gaps 420-i to the next object 401. This chain of events continues until the objects 401 that are adjacent one of walls 402 are forced against one of walls 402, thus thermally coupling objects 401 to partition 410-j and 412, to a pair of partitions 410-j, or to a partition 410-j and one of walls 402 and thus securing objects 401 within case 400. A thermally conducting material of the type specially manufactured for thermal contact situations can be deployed between the contact surfaces.

Figure 15:
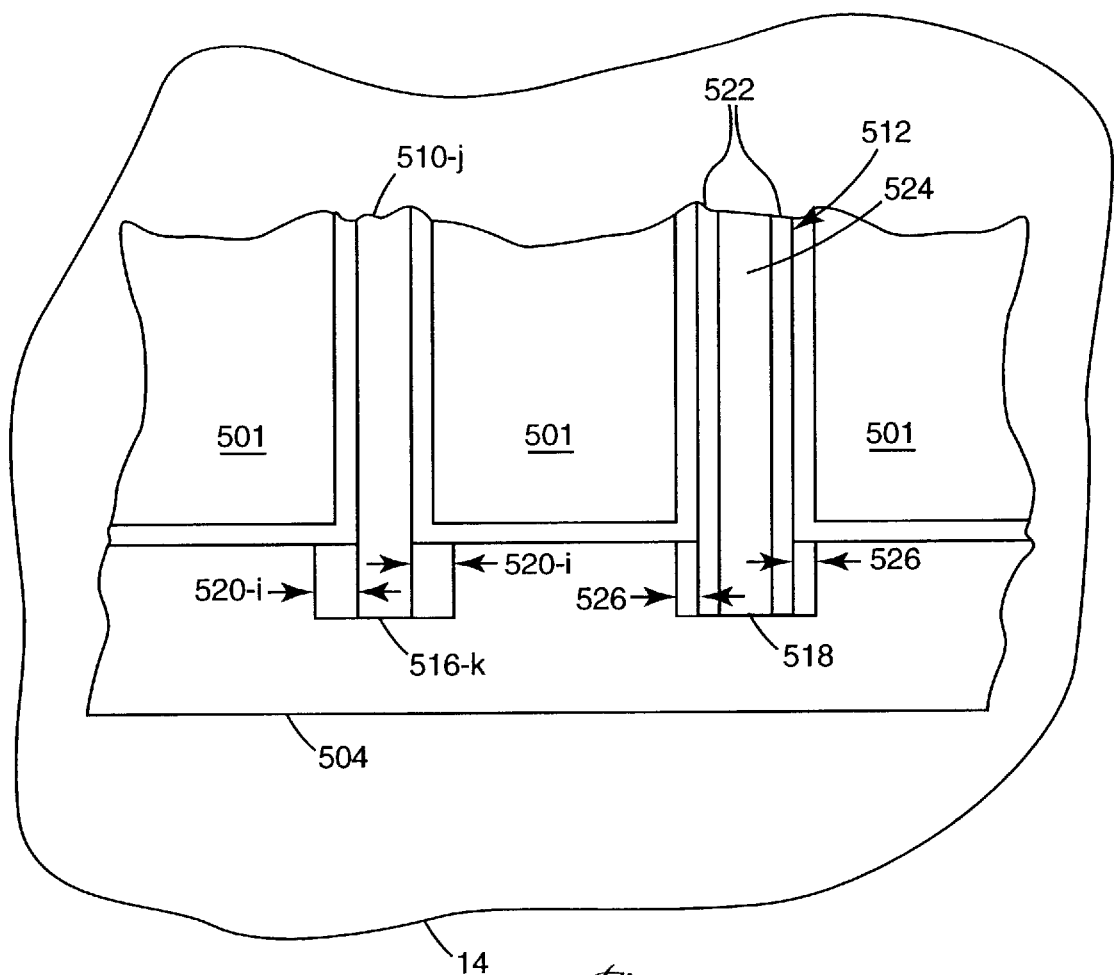
Figure 16:
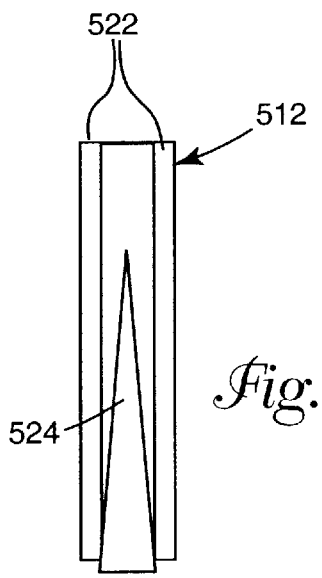

FIG. 15 is an enlarged view of encircled region 14 of FIG. 12 and demonstrates another embodiment of case 400. In one embodiment, partition 510-j is equivalent to partition 410-j of FIG. 14 and is any one of partitions 410-1 to 410-N of FIG. 12. In one embodiment, slot 516-k is equivalent to slot 416-k of FIG. 14 and is any one of slots 416-1 to 416-M of FIG. 13. Slot 516-k is adapted to provide a clearance gap 520-i on either side of partition 510-j. In one embodiment, slot 520-i is equivalent to slot 420-i of FIG. 14. Partition 512 includes a pair of outer layers 522. Layers 522 can be of any material having suitable thermal and strength properties, such as aluminum, copper, etc. Wedge 524 is inserted between layers 522, as demonstrated in FIG. 16, a top view of partition 524. Wedge 524 can be any suitable material, e.g., plastic, aluminum, copper, or the like. In another embodiment, wedge 512 is replaced by several wedges positioned one above the other at discrete vertical locations between layers 522. Slot 518 is adapted to provide a clearance gap 526 on either side of partition 512.

In one embodiment, wedge 524 exerts a force on each of layers 522, which in turn bear against and transmit the force to adjacent objects 501, as facilitated by clearance gaps 526. In one embodiment objects 501 are equivalent to objects 401 in FIG. 14. In turn, an object 501 bears against an adjacent partition 510-j, which transmits the force, as facilitated by clearance gaps 520-i to the next object 501. This chain of events continues until the objects 501 that are adjacent one of walls 402 are forced against one of walls 402, thus thermally coupling objects 501 to partition 510-j and 512, to a pair of partitions 510-j, or to a partition 510-j and one of walls 402 and thus securing objects 401 within case 400. A thermally conducting material of the type specially manufactured for thermal contact situations can be deployed between the contact surfaces.

In another embodiment of the present invention, each heat sink is configured to encapsulate a phase-change material (PCM) that changes from a solid to a liquid and vice versa. The PCM can be any suitable liquid-solid PCM, such as paraffin. In another embodiment of the present invention each heat sink is configured to encapsulate a PCM that changes from a liquid to a vapor and vice versa. The PCM can be any suitable liquid-vapor PCM, such as FLUROINERT, a product of Dow Chemical Corporation. In another embodiment of the present invention, each heat sink is configured to include at least one heat pipe.

To manufacture apparatus 100, partial-shell 110, including an aperture and a multitude fins on its exterior, as demonstrated by fin 112 in FIG. 1, is formed. Cover 114 is formed and used to selectively seal the aperture against the weather and a pressure differential. Base 136 having lead-out 140, such as for wiring, is also formed.

Case 106, adapted to confine the objects to different locations within the housing, is formed. Forming case 106 involves forming a frame, partition 126, and a plurality of second partitions, demonstrated by partition 122 in FIG. 2.

The region within the frame is divided into two regions using partition 126, each region is divided into a plurality of sections, demonstrated by section 124 in FIG. 2, using the plurality of partitions 122, and a plurality of slots, demonstrated by slots 128a and b, is formed in each of the sections 124. Thermal couplings between each of the partitions 122, the frame, and partition 126 are formed. Manufacturing case 106 also involves adapting it to be selectively reconfigured between a non-operating configuration, as demonstrated in FIGS. 5 and 6, and an operating configuration, as demonstrated in FIGS. 3 and 4.

An object, such as an object 104, is either thermally coupled to one of walls 120, partition 126, and a neighboring partition, as exemplified by 122a or to two neighboring partitions, as exemplified by partitions 122b and c, and to partition 126 by first ensuring the case is in the non-operating configuration. Then, the object is inserted into one of the slots, e.g., 128a or b, and the case is selectively reconfigured into the operating configuration. A thermally conducting material of the type specially manufactured for thermal contact situations can be deployed between the mating surfaces of the thermal couplings.

At least one heat sink 108 is formed using a solid block of material. As demonstrated in FIG. 2, two heat sinks 108 can be formed and thermally coupled to one of walls 120, respectively.

Manufacturing apparatus 100 includes manufacturing cage 130, positioning case 106, including at least one heat sink 108 thermally coupled to one of walls 120, within cage 130 so that at least one heat sink 108 protrudes though an opening 132. Cage 130 is attached to base 136. Base 136 is attached to partial-shell 110 to seal housing 102 against the weather and a pressure differential. Sealing housing 102 using base 102 also includes sealing lead-out 140 of base 136 against the weather and a pressure differential.

Manufacturing apparatus 100 includes thermally coupling at least one heat sink 108 to partial shell 110, thermal coupling accomplished by forming a thermally conducting pad 138 and thermally coupling it to the interior of partial-shell 110. Thermal coupling between heat sink 108 and partial shell 110 is established by bringing heat sink 108 into thermal contact with a corresponding thermally conducting pad 138, accomplished by positioning cage 130 within partial-shell 110.

To manufacture apparatus 200, partial-shells 210a and b, each having a number of fins on their respective exteriors, as demonstrated by fins 212a and b, respectively, in FIGS. 7 and 8 are formed. A case that can be structurally and functionally equivalent to case 106, described above for apparatus 100 is formed. At least one heat sink is formed and thermally coupled to the case. As for apparatus 100, two heat sinks can be coupled to two opposing walls of the case.

Manufacturing apparatus 200 includes forming cage 230 and positioning the case, including at least one sink thermally coupled thereto, within it so that at least one heat sink protrudes an opening 232. Manufacturing apparatus 200 includes butting partial-shells 210a and b together to form a single-shell about cage 230 that has opposing first and second openings, respectively comprising openings 210a1 and b1 and 210a2 and b2, shown in FIG. 8. The first and second openings are coincident with opening 230b and the second opening framed by flange 230c of cage 230, respectively. Butting partial-shells 210a and b together can include sealing the abutment against the weather and pressure differential using a suitable material that can also thermally couple partial-shells 210a and b.

Cover 214 is formed and is used to selectively simultaneously cover the first opening in the single-shell and seal the opening 230b of the cage against the weather and a pressure differential. In another embodiment, gasket 231a is a heat sink and is used to thermally couple the case to cover 214. Cover 236 having lead-out 240 is formed and is used to simultaneously close at least a portion of the second opening in the single-shell and seal the opening of cage 230 framed by flange 230c against the weather and a pressure differential. Sealing the opening of cage 230 framed by flange 230c also involves sealing lead-out 240 against the weather and a pressure differential. Sealing opening 230b and the opening framed by flange 230c of the cage also seals the objects contained within the case against the weather and a pressure differential.

Manufacturing apparatus 200 includes thermally coupling at least one heat sink to partial-shells 210a or b. The thermal coupling is accomplished when partial-shells 210a and b are butted together to form a single-shell about cage 230, and at least one heat sink protrudes through one opening 232 in cage 230 and abuts a corresponding thermally conducting pad 238. A suitable thermally conducting material can be deployed between the heat sink and thermally conducting pad 238.

To manufacture apparatus 300, shell 304 is formed. The interior of shell 304 so formed is divided into a pair of compartments, such as compartment 308 in FIG. 11, by partition 310. Shell 304 so formed has a pair of first apertures 312 and a second aperture opposite apertures 312. Shell 310 so formed has at least one third aperture 314 located in one compartment between and perpendicular to one of apertures 312 and the second aperture. Shell 304 so formed can have a pair opposing apertures 314 in each compartment, as demonstrated for compartment 308 in FIG. 11, however.

At least one case 324 that can be structurally and functionally equivalent to the case 106 of apparatus 100 is formed. Case 324 is positioned in the compartment having aperture 314. A pair of first covers 306 is formed and each is used to selectively seal one of the first apertures 312 against the weather and a pressure differential. A second cover having a lead-out for wires is formed and used to selectively seal the second aperture. Sealing the second aperture involves sealing the lead-out against the weather and a pressure differential.

At least one third cover 316 is formed. Cover 316 so formed has a number of fins, as demonstrated by fin 307, on its exterior. Third cover 316 is used to seal aperture 314 against the weather and a pressure differential. Portion 322 of cover 316 can be thermally coupled to shell 304. At least one heat sink 320 is formed and thermally coupled to case 324 and the interior of cover 316.

In the configuration, as demonstrated in FIG. 11, where there can be a pair opposing apertures 314 in each compartment, a case 324 can be located in each compartment. In this configuration, each aperture 314 is sealed against the weather and a pressure differential by a cover 316. A heat sink 320 is thermally coupled to the interior of each cover 316 and a case 324. Portion 322 of each cover 316 can be thermally coupled to shell 304.

In another embodiment of the present invention, each heat sink is manufactured by configuring it to encapsulate a PCM that changes from a solid to a liquid and vice versa. In another embodiment of the present invention, each heat sink is manufactured by configuring it to encapsulate a PCM that changes from a liquid to a vapor and vice versa. In another embodiment of the present invention, each heat sink is manufactured by configuring it to include at least one heat pipe.

CONCLUSION

Embodiments of the present invention have been described. The embodiments provide a housing adapted to contain objects, for example electronic circuit cards; at least one case located within the housing, the case adapted to confine the objects to different locations within the housing, the case also thermally coupled to the objects; and at least one heat sink adapted to absorb heat from the case, the heat sink thermally coupled to the case and the housing.

Although specific embodiments have been illustrated and described in this specification, it will be appreciated by those of ordinary skill in the art that any arrangement that is calculated to achieve the same purpose can be substituted for the specific embodiment shown. This application is intended to cover any adaptations or variations of the present invention.

What is claimed is:

1. An apparatus comprising:
a housing adapted to contain objects;
at least one case disposed within the housing, the case adapted to confine the objects to different locations within the housing, the case thermally coupled to the objects;
at least one heat sink adapted to absorb heat from the case, the heat sink thermally coupled to the case and the housing; and
at least one thermally conducting pad, the thermally conducting path thermally coupled to an interior surface of the housing and the heat sink.

2. The apparatus of claim 1, wherein the housing includes a lead-out for wires.

3. The apparatus of claim 2, wherein the lead-out is sealed against a pressure differential and the weather.

4. The apparatus of claim 1, wherein the exterior of the housing includes fins.

5. The apparatus of claim 1, wherein the objects are electronic circuit cards.

6. The apparatus of claim 1 further comprising a pressure-relief valve.

7. An apparatus comprising:
a housing adapted to contain objects;
at least one cage disposed within the housing, the cage adapted to confine the objects to different locations within the housing, the cage thermally coupled to the objects, the cage having an opening and a flange that extends around a perimeter of the opening, the flange further having a groove;
a cover adapted to selectively cover the opening of the cage; and
a seal adapted to be received in the groove of the flange to provide a seal from weather and pressure differential when the cover is positioned to cover the opening of the cage; and
at least one heat sink adapted to absorb heat from the case, the heat sink thermally coupled to the case and the housing.

8. An apparatus comprising:
a housing adapted to contain objects;
at least one case disposed within the housing, the case adapted to confine the objects to different locations within the housing, the case thermally coupled to the objects;
at least one heat sink including a phase-change material adapted to absorb heat from the case, the phase-change heat sink thermally coupled to the case and the housing; and
wherein the phase-change heat sink includes a phase-change material that changes from a solid to a liquid and vice versa.

9. An apparatus comprising:
a housing adapted to contain objects;
at least one case disposed within the housing, the case adapted to confine the objects to different locations within the housing, the case thermally coupled to the objects;
at least one heat sink adapted to absorb heat from the case, the heat sink thermally coupled to the case and the housing, wherein the heat sink comprises at least one heat pipe; and
at least one thermally conducting pad, the thermally conducting path thermally coupled to an interior surface of the housing and the heat sink.

10. An apparatus comprising:
a housing adapted to contain objects;
at least one frame disposed within the housing, the frame defining an object-containment volume within the housing, the object-containment volume divided into a plurality of sections by a plurality of partitions, the partitions thermally coupled to the frame, each of the sections divided into a plurality of slots, each slot having an object disposed therein for thermal contact between the partitions and one partition and the frame, at least one of the partitions selectively adapted to be displaced to form a non-operating configuration that facilitates the insertion and removal of the objects; and
at least one heat sink adapted to absorb heat from the frame, the heat sink thermally coupled to the frame and the housing.

11. The apparatus of claim 10, wherein the heat sink is a solid.

12. The apparatus of claim 10, wherein the heat sink comprises a phase-change material.

13. The apparatus of claim 12, wherein the phase change material changes from a solid to a liquid and vice versa.

14. The apparatus of claim 12, wherein the phase change material changes from a liquid to a vapor and vice versa.

15. The apparatus of claim 10, wherein the heat sink comprises at least one heat pipe.

16. An apparatus comprising:
a base;
a partial-shell having an aperture therein, the partial-shell attached to the base, whereby the base and partial-shell define a housing adapted to contain objects, the housing having an aperture;
a cover adapted to close the housing by covering the aperture;
a frame disposed in the housing, the frame defining an object containment volume within the housing, the object containment volume divided into two regions by a first partition, each of the two regions divided into a plurality of sections by a plurality of second partitions, each of the second partitions thermally coupled to the frame and the first partition, each of the sections divided into a plurality of slots, each slot having an object disposed therein for thermal contact between the first partition, a second partition, and one of a second partition and the frame;

at least one heat sink adapted to absorb heat from the frame, the heat sink thermally coupled to the frame and the partial-shell; and a cage attached to the base, the cage adapted to confine the frame, including the heat sink thermally coupled thereto, to the base so that the heat sink extends through the cage, whereby when the partial-shell is attached to the base, the heat sink is thermally coupled to the partial-shell.

17. The apparatus of claim 16, wherein the exterior of the partial-shell includes fins.

18. The apparatus of claim 16, wherein the base seals against the partial-shell to seal the housing against a pressure differential and the weather.

19. The apparatus of claim 16, wherein the base includes a lead-out for wires.

20. The apparatus of claim 19, wherein the lead-out is sealed against a pressure differential and the weather.

21. The apparatus of claim 16, wherein the cover selectively seals the aperture against a pressure differential and the weather.

22. The apparatus of claim 16, wherein at least one of the second partitions comprises two outer layers that sandwich a resilient layer therebetween.

23. The apparatus of claim 16, wherein at least one of the second partitions comprises two outer layers having at least one wedge therebetween.

24. The apparatus of claim 16, wherein the frame is adapted to selective reconfiguration between operating and non-operating configurations, the non-operating configuration comprises the second partitions of one of the regions being displaced relative to the second partitions of the other region, and the operating configuration comprises the second partitions of one of the regions being aligned with the second partitions of the other region.

25. An apparatus comprising:

a cage having continuous opposing first and second openings;

a frame disposed within the cage, the region within the frame divided into two regions by a first partition, each of the two regions divided into a plurality of sections by a plurality of second partitions, each of the second partitions thermally coupled to the frame and the first partition, each of the sections divided into a plurality of slots, each slot having an object disposed therein for thermal contact between the first partition, a second partition, and one of a second partition and the frame;

at least one heat sink adapted to absorb heat from the frame, the heat sink thermally coupled to the frame, as disposed within the cage, the heat sink protruding through the cage;

a pair of partial-shells, the partial shells mated together to form a single-shell about the cage so that at least one heat sink, protruding through the cage, is thermally coupled to at least one of the partial-shells, the single-shell so formed having first and second openings, the first opening of the single-shell coincident with first opening of the cage and at least a portion of the second opening of the single-shell coincident with the second opening of the cage;

a first cover adapted to simultaneously selectively cover the first opening of the single shell and seal the first opening of the cage against the weather and a pressure differential; and a second cover adapted to simultaneously cover at least a portion of the second opening of the single-shell and seal the second opening of the cage against the weather and a pressure differential.

26. The apparatus of claim 25, wherein each of the partial shells includes fins on their respective exteriors.

27. The apparatus of claim 25, wherein the second cover includes a lead-out for electrical wires.

28. The apparatus of claim 27, wherein the lead-out is sealed against a pressure differential and the weather.

29. The apparatus of claim 25, wherein at least one of the second partitions comprises two outer layers that sandwich a resilient layer therebetween.

30. The apparatus of claim 25, wherein at least one of the second partitions comprises two outer layers having at least one wedge therebetween.

31. The apparatus of claim 25, wherein the frame is adapted to selective reconfiguration between operating and non-operating configurations, the non-operating configuration comprises the second partitions of one of the regions being displaced relative to the second partitions of the other region, and the operating configuration comprises the second partitions of one of the regions being aligned with the second partitions of the other region.

32. The apparatus of claim 25, further comprising at least one heat sink adapted to thermally couple the frame to the first cover.

33. An apparatus comprising:

a shell, the interior of the shell divided into two compartments by a first partition, the shell having a pair of adjacent first apertures in the same plane, one first aperture for each compartment, the shell having a second aperture opposite the first apertures, the shell having at least one third aperture, the third aperture in one of the compartments between and perpendicular to one of the first apertures and the second aperture;

a pair of first covers, each adapted to selectively seal one of the first apertures against the weather and a pressure differential;

a second cover adapted to seal the second aperture against the weather and a pressure differential;

at least one third cover adapted to seal the third aperture against the weather and a pressure differential;

at least one frame, the frame disposed in one of the compartments, the frame divided into two regions by a second partition, each of the two regions divided into a plurality of sections by a plurality of third partitions, each of the third partitions thermally coupled to the frame and the second partition, each of the sections divided into a plurality of slots, each slot having an object disposed therein for thermal contact between the second partition, a third partition, and one of a third partition and the frame; and at least one heat sink thermally coupled to the frame and the third cover, the heat sink adapted to absorb heat from the frame.

34. The apparatus of claim 33, wherein the third cover includes fins on its exterior.

35. The apparatus of claim 33, wherein the second cover includes a lead-out for wires.

36. The apparatus of claim 35, wherein the lead-out is sealed against a pressure differential and the weather.

37. The apparatus of claim 33, wherein at least one of the second partitions comprises two outer layers that sandwich a resilient layer therebetween.

38. The apparatus of claim 33, wherein at least one of the second partitions comprises two outer layers having at least one wedge therebetween.

39. The apparatus of claim 33, wherein the frame adapted to selective reconfiguration between operating and non-operating configurations, the non-operating configuration comprises the third partitions of one of the regions being displaced relative to the third partitions of the other region, and the operating configuration comprises the third partitions of one of the regions being aligned with the third partitions of the other region.

40. The apparatus of claim 33, further comprising a pair of tethers, each interconnecting one of the pair of first covers to the shell.

41. The apparatus of claim 40, wherein each tether is nonmetallic.

42. A method for manufacturing an apparatus for containing objects, the method comprising:
forming a housing;
forming at least one case adapted to confine the objects to different locations within the housing;
forming at least one heat sink adapted to absorb heat from the case;
forming a thermal coupling between the objects and the case;
forming a thermal coupling between the case and the heat sink;
disposing the case, as thermally coupled to the objects and the heat sink, within the housing;
forming a thermal coupling between the heat sink, as thermally coupled to the case, and the housing; and
disposing a thermally conducting pad between the heat sink and an internal surface of the housing.

43. The method of claim 42, wherein forming the housing includes providing a lead-out in the housing for wires.

44. The method of claim 43, further comprising sealing the lead-out so that the housing is sealed against the weather and a pressure differential.

45. The method of claim 42, wherein forming the housing includes forming fins on the exterior of the housing.

46. The method of claim 42, wherein forming the heat sink includes using a solid for the heat sink.

47. The method of claim 42, wherein forming the heat sink includes using a phase-change material for the heat sink.

48. The method of claim 47, wherein using a phase-change material for the heat sink includes using a phase-change material that changes from a solid to a liquid and vice versa.

49. The method of claim 47, wherein using a phase-change material for the heat sink includes using a phase-change material that changes from a liquid to a vapor and vice versa.

50. The method of claim 42, wherein forming the heat sink includes using at least one heat pipe for the heat sink.

51. A method for manufacturing an apparatus for containing objects, the method comprising:
forming a housing;
forming at least one frame, the frame defining an object-containing volume within the housing;
partitioning the object-containing volume into plurality of sections using a plurality of partitions;
forming a thermal coupling between each of the partitions and the frame;
forming a plurality of slots in each of the sections;
displacing one or more of the partitions with respect to the remaining partitions to place the frame in a non-operating configuration to allow easy access to the slots;
inserting the objects into the slots;
repositioning the one or more partitions that were displaced during in the non-operating configuration once the objects are inserted in the slot to place the frame in an operating configuration;
forming a thermal coupling between the objects and the partitions and the partitions the frame;
forming at least one heat sink adapted to absorb heat from the frame;
forming a thermal coupling between the frame and the heat sink;
disposing the frame, as thermally coupled to the objects and the and heat sink, within the housing; and
forming a thermal coupling between the heat sink, as thermally coupled to the frame, and the housing.

52. A method for manufacturing an apparatus for containing objects, the method comprising:
forming a partial-shell;
forming an aperture in the partial-shell;
forming fins on the exterior of the partial-shell;
forming a base;
forming a cover;
using the cover to selectively seal the aperture against the a pressure differential and the weather;
forming a frame;
forming a first partition;
dividing the region within the frame into two regions using the first partition;
forming a plurality of second partitions;
dividing each of the two regions into a plurality of sections using the plurality of second partitions;
forming a thermal coupling between each of the partitions and the frame and the first partition;
forming a plurality of slots in each of the sections;
inserting the objects into the slots;
forming a thermal coupling between the objects and the first partition, a second partition, and one of a second partition and the frame;
forming at least one heat sink adapted to absorb heat from the frame;
forming a thermal coupling between the frame and the heat sink;
disposing the frame, as thermally coupled to the objects and the and heat sink, within the partial shell;
forming a thermal coupling between the heat sink, as thermally coupled to the frame, and the partial-shell; and
using the base to seal the partial-shell, as thermally coupled to the heat sink.

53. The method of claim 52, wherein disposing the frame within the partial-shell comprises:
forming a cage;
disposing the frame within a cage so that the heat sink protrudes an opening in the cage; and
attaching the cage to the base.

54. The method of claim 52, wherein forming the base includes forming a lead-out for wires in the base.

55. The method of claim 54, wherein using the base to seal the partial-shell includes sealing the lead-out.

56. The method of claim 52 wherein forming the second partitions includes forming at least one of the second partitions by forming a pair of outer layers and disposing a layer of resilient material between the outer layers.

57. The method of claim 52 wherein forming the second partitions includes forming at least one of the second partitions by forming a pair of outer layers and inserting at least one wedge between the outer layers.

58. The method of claim 52 further comprising adapting the frame to be selectively reconfigured between a non-operating configuration and an operating configuration, wherein the non-operating configuration comprises the second partitions of one the regions being displaced relative to the second partitions of the other region, wherein the operating configuration comprises the second partitions of one of regions being aligned with the second partitions of the other region.

59. The method of claim 58, wherein inserting the objects into the slots comprises inserting the objects into the slots while the frame is in the non-operating configuration.

60. The method of claim 59, wherein forming a thermal coupling between the objects and the first partition, a second partition, and one of a second partition and the frame is accomplished by reconfiguring the frame to the operating configuration.

61. A method for manufacturing an apparatus for containing objects, the method comprising:

forming a pair of partial-shells;

forming fins on each of the partial-shells;

forming a cage having continuous opposing first and second openings;

forming a frame;

forming a first partition;

dividing the region within the frame into two regions using the first partition;

forming a plurality of second partitions;

dividing each of the two regions into a plurality of sections using the plurality of second partitions;

forming a thermal coupling between each of the partitions and the frame and the first partition;

forming a plurality of slots in each of the sections;

inserting the objects into the slots;

forming a thermal coupling between the objects the first partition, a second partition, and one of a second partition and the frame;

forming at least one heat sink adapted to absorb heat from the frame;

forming a thermal coupling between the frame and the heat sink;

disposing the frame containing the objects and having at least one heat sink coupled thereto, within the cage so the heat sink protrudes through the cage;

abutting the partial-shells to form a single-shell, having opposing first and second openings, around the cage so the first opening of the cage coincides with the first opening of the single-shell, the second opening of the cage coincides with at least a portion of the second opening of the single shell, and at least one heat sink protruding through the cage is thermally coupled to one of the partial shells;

forming a first cover;

using the first cover to simultaneously selectively cover the first opening of the single-shell and seal the first opening of the cage against the a pressure differential and the weather;

forming a second cover; and using the second cover to simultaneously cover a portion of the second opening of the single-shell and seal the second opening of the cage against the weather.

62. The method of claim 61, wherein forming the second cover includes forming a lead-out for wires in the second cover.

63. The method of claim 62, wherein using the second cover to seal the partial-shell includes sealing the lead-out.

64. The method of claim 61, wherein abutting the partial shells comprises forming a thermal coupling between the shells.

65. The method of claim 61, wherein abutting the partial shells comprises sealing the abutment against the weather and a pressure differential.

66. The method of claim 61 wherein forming the second partitions includes forming at least one of the second partitions by forming a pair of outer layers and disposing a layer of resilient material between the outer layers.

67. The method of claim 61 wherein forming the second partitions includes forming at least one of the second partitions by forming a pair of outer layers and inserting at least one wedge between the outer layers.

68. The method of claim 61 further comprising adapting the frame to be selectively reconfigured between a non-operating configuration and an operating configuration, wherein the non-operating configuration comprises the second partitions of one the regions being displaced relative to the second partitions of the other region, wherein the operating configuration comprises the second partitions of one of regions being aligned with the second partitions of the other region.

69. The method of claim 68, wherein inserting the objects into the slots comprises inserting the objects into the slots while the frame is in the non-operating configuration.

70. The method of claim 69, wherein forming a thermal coupling between the objects and the first partition, a second partition, and one of a second partition and the frame is accomplished by reconfiguring the frame to the operating configuration.

71. The method of claim 61, wherein forming at least one heat sink includes forming at least two heat sinks.

72. The method of claim 71, wherein forming the thermal coupling between the frame and the heat sink includes forming a thermal coupling between the frame and the at least two heat sinks.

73. The method of claim 72, further comprising forming a thermal coupling between at least one of the at least two heat sinks and the first cover.

74. A method for manufacturing an apparatus for containing objects, the method comprising:

forming a shell;

forming a first partition to divide the interior of the shell into two compartments;

forming an pair adjacent first apertures in the shell, one first aperture for each compartment;

forming a second aperture in the shell opposite the first apertures;

forming at least one third aperture in the shell between and perpendicular to one of the first apertures and the second aperture, the third aperture opening into one of the compartments;

forming a pair of first covers;

using each of the first covers to selectively seal each of the first apertures against a pressure differential and the weather;

forming at least one frame;

forming a second partition;

dividing the region within the frame into two regions using the second partition;

forming a plurality of third partitions;

dividing each of the two regions of the frame into a plurality of sections using the plurality of third partitions;

forming a thermal coupling between each of the third partitions and the frame and the second partition;

forming a plurality of slots in each of the sections of the frame;

inserting the objects into the slots;

forming a thermal coupling between the objects and the second partition, a third partition, and one of a third partition and the frame;

forming a second cover;

forming at least one third cover;

forming fins on the exterior of the third cover;

disposing frame, as thermally coupled to the objects, within one of the compartments;

forming at least one heat sink, the heat sink adapted to absorb heat from the frame;

forming a thermal coupling between interior the third cover and the heat sink;

forming a thermal coupling between the heat sink and the frame;

using the third cover to seal the third aperture against the weather and a pressure differential; and using the second cover to seal the second aperture against the weather and a pressure differential.

75. The method of claim 74, wherein forming the second cover includes forming a lead-out for wires in the second cover.

76. The method of claim 75, wherein using the second cover to seal the shell includes sealing the lead-out.

77. The method of claim 74 wherein forming the second partitions includes forming at least one of the second partitions by forming a pair of outer layers and disposing a layer of resilient material between the outer layers.

78. The method of claim 74 wherein forming the second partitions includes forming at least one of the second partitions by forming a pair of outer layers and inserting at least one wedge between the outer layers.

79. The method of claim 74 further comprising adapting the frame to be selectively reconfigured between a non-operating configuration and an operating configuration, wherein the non-operating configuration comprises the third partitions of one the regions being displaced relative to the third partitions of the other region, wherein the operating configuration comprises the third partitions of one of regions being aligned with the third partitions of the other region.

80. The method of claim 79, wherein inserting the objects into the slots comprises inserting the objects into the slots while the frame is in the non-operating configuration.

81. The method of claim 80, wherein forming a thermal coupling between the objects and the second partition, a third partition, and one of a third partition and the frame is accomplished by reconfiguring the frame to the operating configuration.

82. The method of claim 74, further comprising connecting each of the pair of first covers to the shell using each of a pair of tethers, respectively.

83. The method of claim 82, wherein connecting each of the pair of first covers to the shell using each of a pair of tethers, respectively, includes using tethers of a nonmetallic material.

84. A method for reducing the temperature in a housing containing an array of heat-dissipating objects, the method comprising:

forming at least one case adapted to confine the objects to different locations within the housing;

forming at least one heat sink adapted to absorb heat from the case;

forming a thermal coupling between the case and the heat sink;

disposing the case, as thermally coupled to the objects and the heat sink, within the housing; and forming a thermal coupling between the heat sink, as thermally coupled to the case, and the housing.

85. The method of claim 84, wherein forming the case comprises:

forming a frame;

forming a first partition;

dividing the region within the frame into two regions using the first partition;

forming a plurality of second partitions;

dividing each of the two regions into a plurality of sections using the plurality of second partitions;

forming a thermal coupling between each of the partitions and the frame and the first partition;

forming a plurality of slots in each of the sections;

inserting the objects into the; and forming a thermal coupling between the objects and the first partition, a second partition, and one of a second partition and the frame.

86. The method of claim 84, wherein forming the heat sink includes using a solid for the heat sink.

87. The method of claim 84, wherein forming the heat sink includes using a phase-change material for the heat sink.

88. The method of claim 87, wherein using a phase-change material for the heat sink includes using a phase-change material that changes from a solid to a liquid and vice versa.

89. The method of claim 88, wherein using a phase-change material for the heat sink includes using a phase-change material that changes from a liquid to a vapor and vice versa.

90. The method of claim 84, wherein forming the heat sink includes using at least one heat pipe for the heat sink.

91. The method of claim 85, wherein forming the second partitions includes forming at least one of the second partitions by forming a pair of outer layers and disposing a layer of resilient material between the outer layers.

92. The method of claim 85 wherein forming the second partitions includes forming at least one of the second partitions by forming a pair of outer layers and
inserting at least one wedge between the outer layers.

93. The method of claim 85 further comprising adapting the frame to be selectively reconfigured between a non-operating configuration and an operating configuration, wherein the non-operating configuration comprises the second partitions of one the regions being displaced relative to the second partitions of the other region, wherein the operating configuration comprises the second partitions of one of regions being aligned with the second partitions of the other region.

94. The method of claim 93, wherein inserting the objects into the slots comprises inserting the objects into the slots while the frame is in the non-operating configuration.

95. The method of claim 94, wherein forming a thermal coupling between the objects and the first partition, a second partition, and one of a second partition and the frame is accomplished by reconfiguring the frame to the operating configuration.

96. The apparatus of claim 1, the heat sink further comprising:
a contact surface adapted to abut the thermally conductive pad to form the thermal coupling.

97. The apparatus of claim 1, wherein the contact surface is polished to enhance thermal coupling.

98. The apparatus of claim 1, wherein the material of the contact pad is made from a group comprising aluminum and copper.

99. The apparatus of claim 1, wherein the thermally conductive pad is thermally coupled to the inside surface of the housing by one selected from a group comprising molding, brazing, thermally conductive epoxy and screwing.

100. The apparatus of claim 1, wherein the inside surface of the housing is polished to enhance thermal coupling.

101. The apparatus of claim 10, wherein the at least one of the partitions is displaced in relation to another of the partitions.

102. The apparatus of claim 10, wherein the frame comprises two or more walls, wherein at least one of the two or more walls is adapted to be selectively displaced to form a non-operating configuration that facilitates the insertion and removal of the objects.

103. The apparatus of claim 102, wherein the at least one of the two or more walls is adapted to be selectively displaced with relation to another of the one of the two or more walls.

104. The apparatus of claim 42, wherein the thermally conductive pad is thermally coupled to the inside surface of the housing by the method selected from a group comprising molding, brazing, thermally conductive epoxy and screwing.

105. The method of claim 51, wherein the frame has two or more frame walls, the method further comprising:
displacing at least one of frame walls in relation to another of the frame walls when the frame is in the non-operating configuration.

106. A housing apparatus comprising:
a shell adapted to receive a case in an internal compartment; and
a heat sink having a first end adapted to protrude through an aperture in the shell, the first end of the heat sink is further adapted to be in direct thermal contact with the case through the aperture in the shell.

107. The housing apparatus of claim 106, further comprising:
a case cover adapted to seal an opening in the shell to the internal compartment from weather and pressure differential.

108. The housing apparatus of claim 106, wherein the case is thermally coupled to the shell.

109. The housing apparatus of claim 106, further comprising:
a cover thermally coupled to a second end of the heat sink.

110. The housing apparatus of claim 109, further comprising:: fins thermally coupled to the cover.

111. The housing apparatus of claim 109, wherein the cover is adapted to seal the aperture in the shell from weather and pressure differential.

112. The housing apparatus of claim 109, wherein at least a portion of the cover is thermally coupled to the shell.

113. The housing apparatus of claim 106, wherein the case is adapted to confine electronic circuit cards to different locations within the case.

114. The housing apparatus of claim 113, wherein the electronic cards are thermally connected to the case.

115. The housing apparatus of claim 106, wherein the heat sinks is configured to encapsulate phase-change material to absorb heat.

116. The housing apparatus of claim 115, wherein the phase-change material changes from a solid to a liquid and vice versa.

117. The housing apparatus of claim 115, wherein the phase-change material changes from a liquid to a vapor and vice versa.

118. A housing apparatus comprising:
a shell having an outside surface and at least one internal compartment, the internal compartment having an access aperture to the outside surface, the shell further having at least one heat sink aperture also extending from the surface of the shell into the at least one internal compartment;
a case for each internal compartment, each case is adapted to be received in an associated internal compartment through the associated access aperture;
one or more covers having a first surface, the first surface of each cover having a portion adapted to abut a portion of the outside surface of the shell; and
one or more heat sinks for each cover, each heat sink being thermally coupled to a portion of the first surface of an associated cover, one of the one or more heat sinks being adapted to extend through an associated heat sink aperture to form a thermal couple with an associated case in an associated internal compartment of the shell when the associated cover abuts the outside surface of the shell.

119. The housing apparatus of claim 118, wherein each case is thermally coupled to the shell when it is received in its associated internal compartment.

120. The housing apparatus of claim 118, further comprising:
a case cover for each internal compartment, each case cover adapted to seal an associated access aperture from weather and pressure differentials.

121. The housing apparatus of claim 118, wherein each cover is adapted to seal an associated access aperture from weather and pressure differentials.

122. The housing apparatus of claim 118, wherein each cover further includes a second surface positioned opposite the first surface, each cover further comprising:
a plurality of fins thermally coupled to the second surface of the cover.

123. The housing apparatus of claim 118, wherein the case is adapted to confine objects to different locations within the case.

124. The housing apparatus of claim 123, wherein the case is thermally coupled to at least one of the objects.

125. The housing apparatus of claim 123, wherein the objects are electronic circuit cards.

126. The housing apparatus of claim 118, wherein at least one of the heat sinks is configured to encapsulate phase-change material to absorb heat.

127. The housing apparatus of claim 126, wherein the phase-change material changes from a solid to a liquid and vice versa.

128. The housing apparatus of claim 126, wherein the phase-change material changes from a liquid to a vapor and vice versa.

129. A housing apparatus comprising:

a shell having a first end and a second end positioned opposite the first end, the shell further having one or more sidewalls extending between the first end and the second end, the shell having at least one compartment that extends into the first end, the shell further having at least heat sink one aperture for each compartment, each heat sink aperture extending from an outside surface of one of the one or more sidewalls into an associated compartment in the shell;

a case for each compartment, each case being adapted to be thermally coupled in an associated compartment;

one or more covers, each cover having a first surface, at least a portion of the first surface of each cover being adapted to abut a portion of the outside surface of the one or more sidewalls of the shell; and one or more heat sinks for each cover, each heat sink being thermally coupled to a portion of the first surface of an associated cover, at least one of the one or more heat sinks being adapted to extend through an associated heat sink aperture when the portion of the first surface of its associated cover abuts the portion of the outside surface of the one of the one or more sidewalls of the shell to form a thermal couple between the at least one of the one or more heat sinks and an associated case to provide a heat transfer path.

130. The housing apparatus of claim 129, wherein each of the covers further include a second surface opposite the first surface, each cover further comprising:

a plurality of fins thermally coupled to the second surface of the cover.

131. The housing apparatus of claim 129, wherein each cover is further adapted to seal an associated heat sink aperture against a pressure differential and the weather.

132. The housing apparatus of claim 129, further comprising:

a case cover for each case, each case cover adapted to seal an associated case from weather and pressure differential.

133. The housing apparatus of claim 129, wherein at least one of the heat sinks is configured to encapsulate phase-change material to absorb heat.

134. The housing apparatus of claim 133, wherein the phase-change material changes from a solid to a liquid and vice versa.

135. The housing apparatus of claim 133, wherein the phase-change material changes from a liquid to a vapor and vice versa.

136. The housing apparatus of claim 129, wherein the case is adapted to confine objects to different locations within the case, the case further being thermally coupled to the objects.

137. The housing apparatus of claim 136, wherein the objects are electronic circuit cards.

* * * * *